United States Patent
Hidaka

(10) Patent No.: US 6,421,294 B2
(45) Date of Patent: Jul. 16, 2002

(54) SEMICONDUCTOR MEMORY DEVICE HAVING LARGE DATA I/O WIDTH AND CAPABLE OF SPEEDING UP DATA INPUT/OUTPUT AND REDUCING POWER CONSUMPTION

(75) Inventor: Hideto Hidaka, Hyogo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 33 days.

(21) Appl. No.: 09/779,842

(22) Filed: Feb. 9, 2001

(30) Foreign Application Priority Data

Mar. 3, 2000 (JP) ........................................ 2000-058851

(51) Int. Cl.$^7$ ................................................ G11C 8/00
(52) U.S. Cl. .......................... 365/230.03; 365/230.06; 365/230.01
(58) Field of Search ................ 365/230.03, 230.06, 365/233, 230.01, 193, 189.01

(56) References Cited

U.S. PATENT DOCUMENTS 6,215,709 B1 * 4/2001 Wright et al. .......... 365/189.11
6,240,046 B1 * 5/2001 Proebsting .................. 365/233

FOREIGN PATENT DOCUMENTS

JP        63-160092        7/1988

* cited by examiner

Primary Examiner—David Nelms
Assistant Examiner—Thong Le
(74) Attorney, Agent, or Firm—McDermott, Will & Emery

(57) ABSTRACT

A memory cell array is split into first and second memory blocks. A switch group splits pairs of global data I/O lines provided in common to the overall memory cell array into regions corresponding to the first and second memory blocks respectively. Column selection in a memory block far from a data input/output circuit is executed while turning off the switch group before selection of the memory blocks, and either a turn-on operation of the switch group or column selection in another memory block is executed after selection of the memory blocks is defined.

20 Claims, 27 Drawing Sheets

SEMICONDUCTOR MEMORY DEVICE HAVING LARGE DATA I/O WIDTH AND CAPABLE OF SPEEDING UP DATA INPUT/OUTPUT AND REDUCING POWER CONSUMPTION

BACKGROUND OF THE INVENTION

1. Field of the Invention

The present invention relates to a semiconductor memory device, and more specifically, it relates to a dynamic semiconductor memory device having a large data I/O width and capable of speeding up data input/output and reducing power consumption.

2. Description of the Background Art

In correspondence to a partial application such as image processing requiring a high memory bandwidth, a memory cell array structure for implementing a large data I/O width is employed for a semiconductor memory device.

Representatively, a DRAM/logic merged memory having a logic circuit and a DRAM (dynamic random access memory) loaded on the same chip is developed. The DRAM/logic merged memory, not provided with I/O pins and external buses generally present between a processor and a DRAM, is capable of executing data transfer with a high degree of freedom, and implements a large data I/O width by providing a number of data I/O lines capable of simultaneously inputting/outputting data in/from a DRAM array part.

However, such a memory cell array structure for implementing a large data I/O width has the following problems:

When the memory is implemented with a higher degree of integration, the size of the memory cell array is increased to increase the length of data I/O lines for transmitting read/write data as well as parasitic capacitances. Further, the number of simultaneously operating data I/O lines is also increased in order to increase the number of simultaneously input/output data. Thus, the following problems are rendered remarkable:

(1) A wiring delay for read/write data on the data I/O lines are unignorably increased to cause a delay in the access time or the like.

(2) Data writing or data reading is simultaneously executed on a number of data I/O lines, to increase current consumption in the data I/O lines.

SUMMARY OF THE INVENTION

An object of the present invention is to speed up data input/output and reduce power consumption in a semiconductor memory device having a large data I/O width.

Briefly stated, the present invention is directed to a semiconductor memory device performing data input/output in response to an address signal, which comprises a memory cell array, a data input/output circuit, a plurality of data lines, a plurality of data line connection switching circuits, a plurality of decoding circuits and a control circuit.

The memory cell array has a plurality of memory cells arranged in rows and columns along first and second directions, and is split into a plurality of memory blocks along the first direction. Any one of the plurality of memory blocks is selected in response to the address signal to be subjected to the data input/output. The data input/output circuit is arranged to be adjacent to one of the plurality of memory blocks along the second direction for executing reading and writing of the data on the memory cell array. The plurality of data lines are provided in common to the plurality of memory blocks along the second direction for transmitting the data between the memory cell array and the data input/output circuit. Each of the plurality of data line connection switching circuit is arranged between adjacent memory blocks for splitting the plurality of data input/output lines into regions corresponding to the respective memory blocks. The plurality of decoding circuits are provided in correspondence to the plurality of memory blocks respectively for executing row selection and column selection responsive to the address signal. The control circuit instructs execution of the row selection and the column selection to each decoding circuit and on-off controls each data line connection switching circuit in response to the address signal.

According to another aspect of the present invention, a semiconductor memory device performing data input/output in response to an address signal comprises a memory cell array, a plurality of decoding circuits and a control circuit.

The memory cell array has a plurality of memory cells arranged in rows and columns along first and second directions, and is split into a plurality of sense amplifier blocks along the first direction. Each of the plurality of sense amplifier blocks is split into a plurality of row blocks along the first direction, and any one of the plurality of row blocks is selected in response to the address signal to be subjected to the data input/output.

Each of the plurality of sense amplifier blocks includes a plurality of pairs of bit lines provided corresponding to the memory cell columns respectively along the second direction in common to the plurality of row blocks, a sense amplifier circuit arranged adjacently to one of the row blocks along the second direction for amplifying data on the plurality of pairs of bit lines, and a plurality of bit line connection switching circuits each arranged between adjacent row blocks for splitting the plurality of pairs of bit lines into regions corresponding to the respective row blocks. The plurality of decoding circuits are provided corresponding to the plurality of row blocks respectively for executing row selection and column selection responsive to the address signal. The control circuit instructs execution of the column selection in a selected row block and turns on each bit line connection switching circuit arranged between the selected row block and the sense amplifier circuit.

According to still another aspect of the present invention, a semiconductor memory device performing data input/output in response to an address signal comprises a memory cell array, a data input/output circuit, a plurality of first data lines, a plurality of intermediate nodes, a plurality of second data lines, a plurality of first data line connection switching circuits, a plurality of second data line connection switching circuits, a plurality of decoding circuits and a control circuit.

The memory cell array has a plurality of memory cells arranged in rows and columns along first and second directions, and is split into a plurality of memory blocks along the first direction. The plurality of memory blocks include first and second memory blocks, either one of which is selected in response to the address signal to be subjected to the data input/output. The data input/output circuit executes reading and writing of the data on the memory cell array. The plurality of (M) first data lines are provided (M: natural number) corresponding to the first memory block along the second direction, and split into a plurality of groups each including N (N: natural number smaller than M) first data lines. The plurality of intermediate nodes are provided in correspondence to the plurality of groups respectively. The plurality of (M) second data lines are provided corresponding to the second memory block along the second direction, and split into a plurality of groups each including N second data lines. One second data line of each group of the plurality of second data lines is connected to corresponding each of the plurality of intermediate nodes. The plurality of first data line connection switching circuits are provided between each of the M first data line and the corresponding intermediate node respectively. The plurality of second data line connection switching circuits are provided between each of the M data lines and the data input/output circuit respectively. The plurality of decoding circuits are provided in correspondence to the plurality of memory blocks respectively for executing row selection and column selection in response to the address signal. The plurality of decoding circuits include a first sub decoding circuit provided corresponding to the first memory block and a second sub decoding circuit provided corresponding to the second memory block. The control circuit instructs execution timings for the row selection and the column selection to the first and second decoding circuits in response to the address signal and one-off controls M first and second data line connection switching circuits.

Accordingly, a principal advantage of the present invention resides in that the data line connection switching circuits split the data input/output lines into the regions corresponding to the respective memory blocks while the data line connection switching circuits can be turned on/off in response to selection of any memory block responsive to the address signal, whereby the operating speed can be increased by precedently executing column selection in a partial memory block or power consumption can be reduced by avoiding driving of the data input/output lines in unnecessary regions.

The bit line connection switching circuits split the bit lines into the regions corresponding to the respective row blocks in the respective sense amplifier blocks while only a bit line connection switching circuit arranged between a row block selected by the address signal and the sense amplifier circuit can be selected and turned on, whereby power consumption can be reduced by avoiding driving of the bit lines in unnecessary regions.

Further, the data line connection switching circuits split the data input/output lines to correspond to the respective memory blocks under a structure requiring N:1 selection of the data input/output lines in the respective memory blocks while the data line connection switching circuits can be turned on/off in response to selection of any memory block responsive to the address signal and column selection can be executed at least in a partial memory block before memory block selection, whereby the data input/output can be speeded up.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Embodiments of the present invention are now described in detail with reference to the drawings.

First Embodiment

Figure 1:
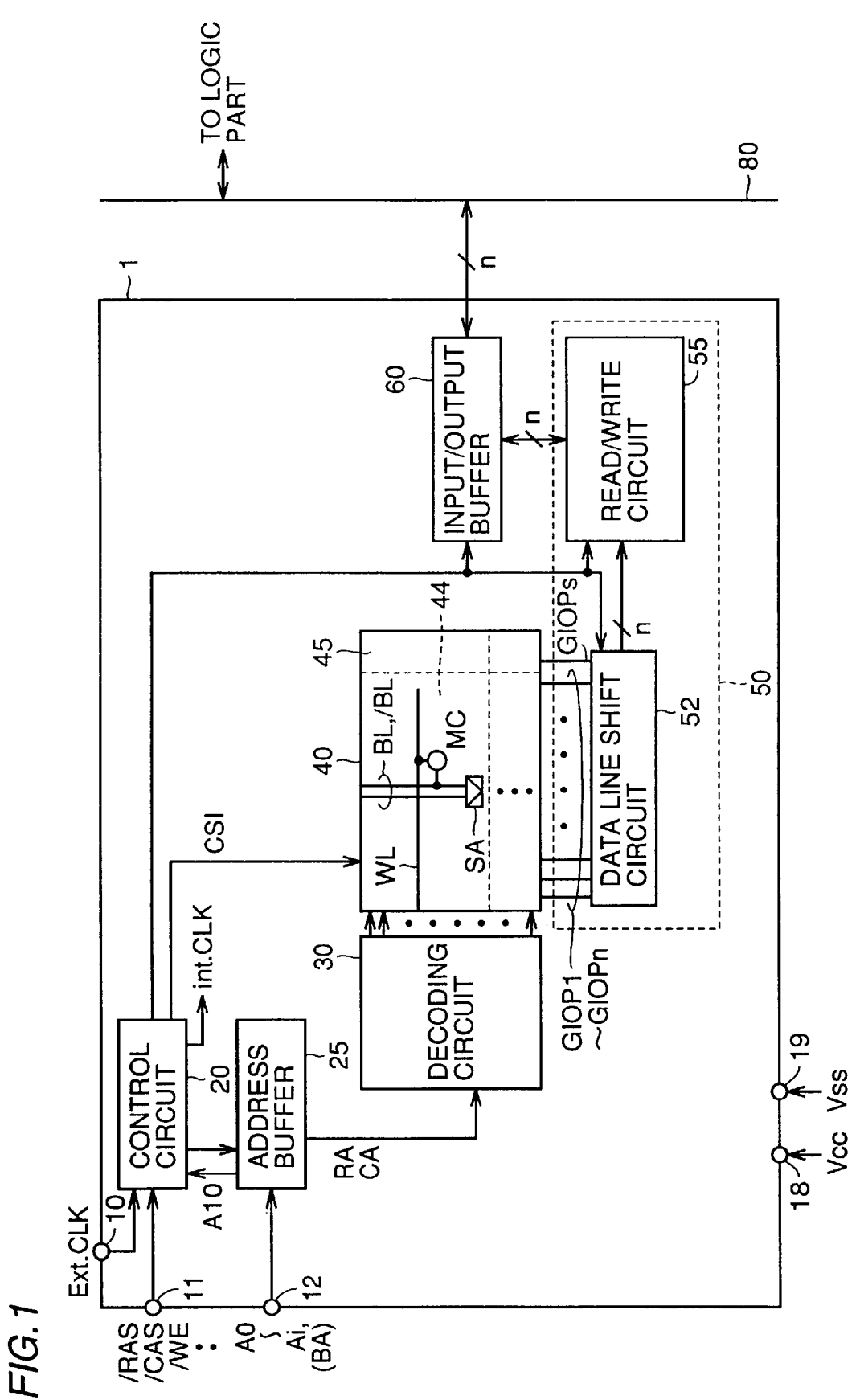
FIG. 1 is a schematic block diagram for illustrating the overall structure of a semiconductor memory device 1 according to a first embodiment of the present invention.

Referring to FIG. 1, a semiconductor memory device 1 according to a first embodiment of the present invention is applied to a DRAM/logic merged memory, for transmitting/receiving data to/from a logic part (not shown) loaded on the same substrate as the semiconductor memory device 1 through an internal bus 80.

The semiconductor memory device 1 comprises a clock terminal 10 receiving an external clock signal Ext.CLK, a control signal terminal 11 receiving command control signals such as a row address strobe signal /RAS, a column address strobe signal /CAS and a write enable signal /WE, and an address terminal 12 receiving respective bits A0 to Ai (i: natural number) of an address signal and a bank address signal. Each of the control signal terminal 11 and the address terminal 12, illustrated as a single terminal in FIG. 1, receives a plurality of signals or a plurality of bits of signals in practice.

In the DRAM/logic merged memory, the logic part supplies the external clock signal Ext.CLK, the command control signals /RAS, /CAS and /WE and the address signal to the clock terminal 10, the control signal terminal 11 and the address terminal 12 respectively.

The semiconductor memory device 1 further comprises a control circuit 20 receiving the clock signal Ext.CLK and the command control signals /RAS, /CAS and /WE from the clock terminal 10 and the control signal terminal 11 and generating various types of commands in response to combinations of the states of the command control signals /RAS, /CAS and /WE on the leading edge of the clock signal Ext.CLK and an address buffer 25 generating a row address signal RA, a column address signal CA and a bank address signal BA from the address signal and the bank address signal input in the address terminal 12.

The control circuit 20 further generates an internal clock signal int.CLK used in the semiconductor memory device 1 in common. One (A10 in FIG. 1) of the address bits A0 to Ai is used also as a signal for automatically starting a precharge operation, and the control circuit 20 executes auto-precharging on a memory cell array 40 in a cycle when the address bit A10 is disabled.

The semiconductor memory device 1 further comprises the memory cell array 40 having a plurality of memory cells arranged in rows and columns. The memory cell array 40 includes a redundant memory cell array 45 provided for redundancy-repairing a fault developed in part of the memory cells forming the memory cell array 40.

The memory cell array 40 is split into a plurality of sense amplifier blocks 44 along the row direction. Each sense amplifier block 44 is provided with a word line WL for each row of the memory cells as well as a sense amplifier SA and a pair of bit lines BL and /BL for each column of the memory cells. FIG. 1 illustratively shows the arrangement of the word line WL, the pair of bit lines BL and /BL and the sense amplifier SA corresponding to a single memory cell MC in the sense amplifier block 44.

The memory cell array 40, the structure of which is described in detail later, is provided with n (n: natural number) pairs of global data I/O lines GIOP1 to GIOPn for the respective sense amplifier blocks 44 in common. The redundant memory cell array 45 is provided with a pair of spare global data I/O lines GIOPs. The pairs of global data I/O lines GIOP1 to GIOPn and GIOPs are input in a data line shift circuit 52.

The data line shift circuit 52 applies shift redundancy to the pairs of global data I/O lines GIOP1 to GIOPn and GIOPs at need in response to a determination as to whether or not redundancy repair with the redundant memory cell array 45 is necessary for selecting n pairs of global data I/O lines from the (n+1) pairs of global data I/O lines GIOP1 to GIOPn and GIOPs and connecting the same with a read/write circuit 55.

The present invention is characterized in that the memory cell array 40 is split into a plurality of memory blocks formed by the plurality of sense amplifier blocks 44 while the pairs of global data I/O lines GIOP1 to GIOPn are split into regions corresponding to the memory blocks respectively and a connection switch group is provided on the split point. The connection switch group is turned on/off in response to a control signal CSI generated by the control circuit 20 on the basis of a result of selection of any memory block in response to the address signal.

Each of the plurality of memory blocks can be treated as an independent bank. In this case, the bank address signal input in the address terminal 12 decides which one of the memory blocks is specified. It is also possible not to operate the plurality of memory blocks as banks but to select each memory block by a partial bit included in the address bits A0 to Ai of the address signal. In this case, the bank address signal may not be input.

The read/write circuit 55 includes a write driver for writing data in the pairs of global data I/O lines GIOP1 to GIOPn and a read amplifier for amplifying data read on the pairs of global data I/O lines GIOP1 to GIOPn. In the following description, the data line shift circuit 52 and the read/write circuit 55 may also be generically referred to as a data input/output circuit 50.

The present invention is not particularly characterized in operations related to redundancy repair, and hence this point may not be mentioned in the following description. In this case, the connective relation between the n pairs of global data I/O lines GIOP1 to GIOPn for transmitting data to the memory cell array 40 and the data input/output circuit 50 having the function of the read/write circuit 55.

The read/write circuit 55 transmits/receives n-bit data to/from an input/output buffer 60. The input/output buffer 60 transmits/receives the n-bit input/output data treated by the read/write circuit 55 to/from the internal bus 80. More specifically, the logic part inputs write data in the input/output buffer 60 through the internal bus 80. The read/write circuit 55 writes the input data in the memory cell array 40 through the pairs of global data I/O lines GIOP1 to GIOPn.

The read amplifier included in the read/write circuit 55 amplifies data read from the memory cell array 40 through the pairs of global data I/O lines GIOP1 to GIOPn, and the input/output buffer 60 outputs the amplified data to the logic part through the internal bus 80.

When not directly executing data input/output from the input/output buffer 60 to the internal bus 80 but separately providing a data input/output terminal capable of transmitting/receiving data to/from an external device for transferring input/output data between the data input/output terminal and the input/output buffer 60, the semiconductor memory device 1 according to the present invention is not restricted to that applied to the DRAM/logic merged memory but can alternatively be treated as an independent memory device.

The structure of the memory cell array 40 is now described in detail with reference to FIG. 2.

Figure 2:
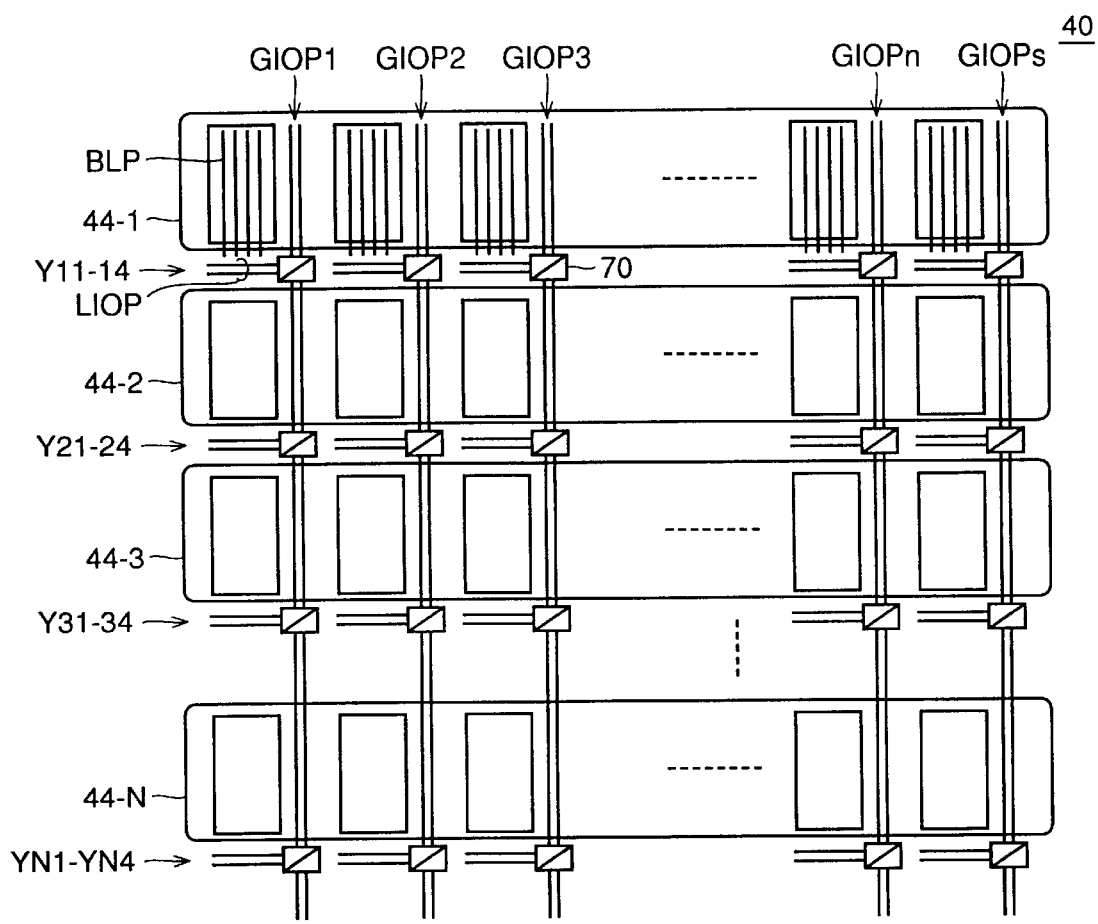
FIG. 2 is a diagram for illustrating the structure of a memory cell array 40 in detail.

Referring to FIG. 2, the memory cell array 40 is split into N (N: natural number) sense amplifier blocks 44-1 to 44-N along the row direction. In each of the sense amplifier blocks 44-1 to 44-N, a pair of bit lines BLP are provided for each memory cell column. The pair of bit lines BLP collectively represent the pair of bit lines BL and /BL appearing in FIG. 1. The memory cell array 40 is provided with the pairs of global data I/O lines GIOP1 to GIOPn as data I/O lines common to the respective sense amplifier blocks 44-1 to 44-N. According to the first embodiment, a pair of global data I/O lines are arranged for four memory cell columns, for example.

Column selection signals are generated for each sense amplifier block for selecting a memory cell column for each pair of global data I/O lines. In the sense amplifier block 44-1, for example, each of column selection signals Y11 to Y14 associates each pair of global data I/O lines with one of corresponding four pairs of bit lines BLP.

In each sense amplifier block, a column selection gate 70 connects each pair of global data I/O lines with the pair of bit lines BLP corresponding to the memory cell column selected by the column selection signals through a pair of local data I/O lines LIOP. The structure of the column selection gate 70 is described in detail later.

The pair of spare global data I/O lines GIOPs are arranged for the redundant memory cell array 45 provided in the memory cell array 40. Redundancy repair is executed in the memory cell array 40 in units of the pairs of global data I/O lines, and the data line shift circuit 52 shown in FIG. 1 performs switching in units of the pairs of global data I/O lines for repairing a defective memory cell when redundancy repair is necessary.

The structure of the column selection gate 70 is now described with reference to FIG. 3.

As described with reference to FIG. 2, the column selection gate 70 is provided for each pair of global data I/O lines in each sense amplifier block. FIG. 3 shows the relation between a pair of global data I/O lines GIOP (GIO and /GIO) and four memory cell columns in a certain sense amplifier block.

Figure 3:
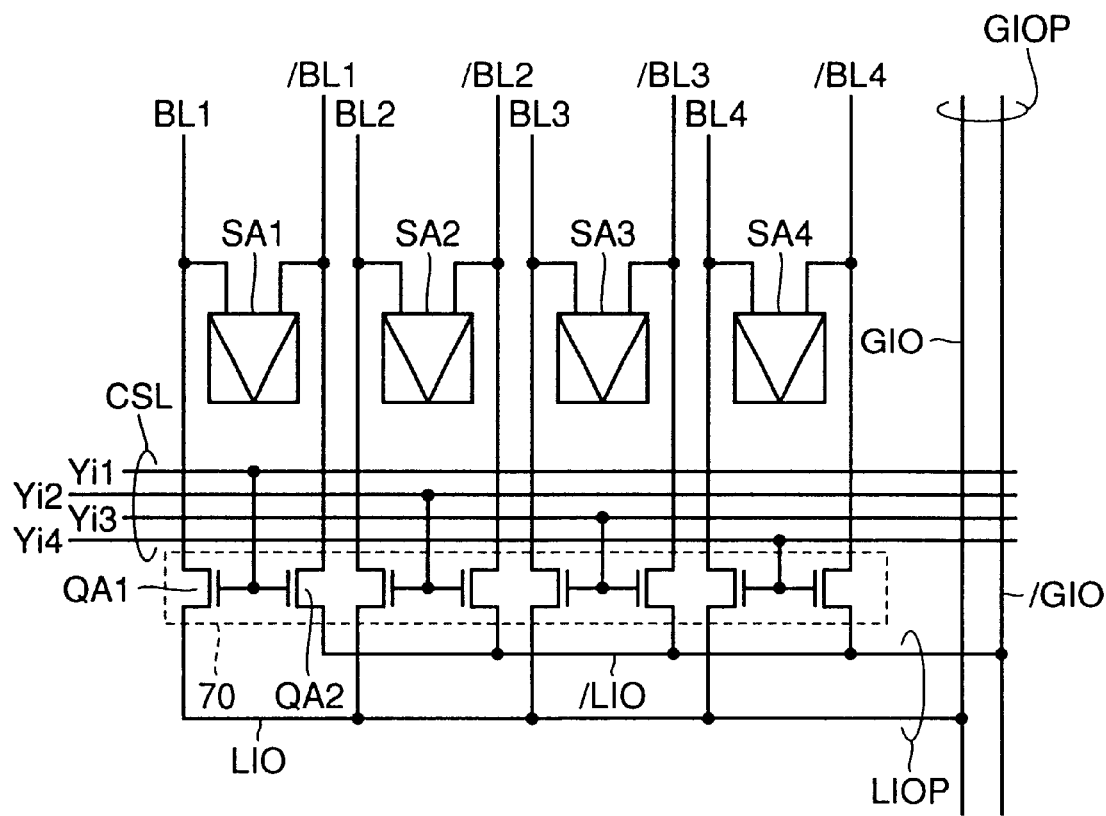
FIG. 3 is a circuit diagram for illustrating the structure of a column selection gate 70.

Referring to FIG. 3, sense amplifiers SA1 to SA4 are arranged in correspondence to the memory cell columns, i.e., the pairs of bit lines respectively in each sense amplifier block. The column selection gate 70 connects one of four pairs of bit lines BL1 and /BL1 to BL4 and /BL4 transmitting voltage signals amplified by the sense amplifiers SA1 to SA4 respectively with the pair of global data I/O lines GIO and /GIO through a pair of local data I/O lines LIO and /LIO.

The column selection gate 70 includes a transistor QA1 coupled between the bit line BL1 and the local data I/O line LIO and a transistor QA2 coupled between the complementary bit line /BL1 and the complementary local data I/O line /LIO.

The transistors QA1 and QA2 receive a column selection signal Yi1 in the gates thereof. As to the column selection signal Yi1 for an i-th (i: natural number of 1 to N) sense amplifier block, one of column selection signals Yi1 to Yi4 is selectively activated (high). When the column selection signal Yi1 is activated, the transistors QA1 and QA2 are turned on so that the pair of bit lines BL1 and /BL1 are connected with the pair of global data I/O lines GIO and /GIO through the pair of local data I/O lines LIO and /LIO respectively.

Figure 4:
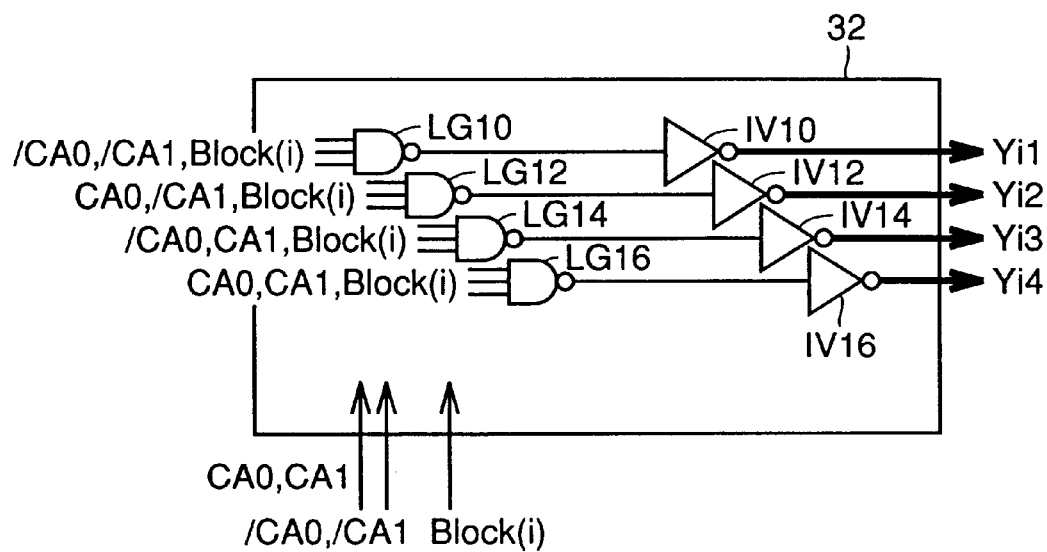
FIG. 4 is a circuit diagram illustrating the structure of a column decoder generating a column selection signal.

Referring to FIG. 4, a column decoder 32 generating the column selection signals Yi1 to Yi4 is included in a decoder circuit 30 shown in FIG. 1. The column decoder 32 generates the column selection signals Yi1 to Yi4 for the i-th sense amplifier block. In practice, column decoders similar in structure to the column decoder 32 are provided in correspondence to the respective sense amplifier blocks.

According to this embodiment, a pair of global data I/O lines are arranged for four memory cell columns, whereby column selection can be executed with a 2-bit column address. The column decoder 32 receives column address bits CA0 and CA1, complementary column address bits /CA0 and /CA1 and a sense amplifier block selection signal Block(i). The sense amplifier block selection signal Block(i) specifying activation/inactivation of the i-th sense amplifier block is generated for each sense amplifier block. The sense amplifier block selection signal Block(i) is generated by decoding the bank address BA, the row address RA or the like.

The column decoder 32 includes a logic gate LG10 outputting a NAND result of the column address bits /CA0 and /CA1 and the sense amplifier block selection signal Block(i), a logic gate LG12 outputting a NAND result of the column address bits CA0 and /CA1 and the sense amplifier block selection signal Block(i), a logic gate LG14 outputting a NAND result of the column address bits /CA0 and CA1 and the sense amplifier block selection signal Block(i) and a logic gate LG16 outputting a NAND result of the column address bits CA0 and CA1 and the sense amplifier block selection signal Block(i).

Inverters IV10 to IV16 invert the outputs of the logic gates LG10 to LG16 respectively and output the inverted results as the column selection signals Yi1 to Yi4. The column selection signals Yi1 to Yi4 are transmitted to the column selection gate 70 through column selection lines CSL shown in FIG. 3. Thus, one of the four column selection signals Yi1 to Yi4 can be selectively activated (high) in the sense amplifier block specified for activation in response to the combination of the column address bits CA0 and CA1 due to the aforementioned structure.

Referring again to FIG. 3, similar structures are applied also to the pairs of bit lines BL2 and /BL2 to BL4 and /BL4 so that the pairs of bit lines BL2 and /BL2 to BL4 and /BL4 are selectively connected with the pairs of global data I/O lines in response to activation of column selection signals.

The arrangement of pairs of global data I/O lines GIO1 and /GIO1 to GIOn and /GIOn in the memory cell array 40 according to the first embodiment is now described with reference to FIG. 5.

Figure 5:
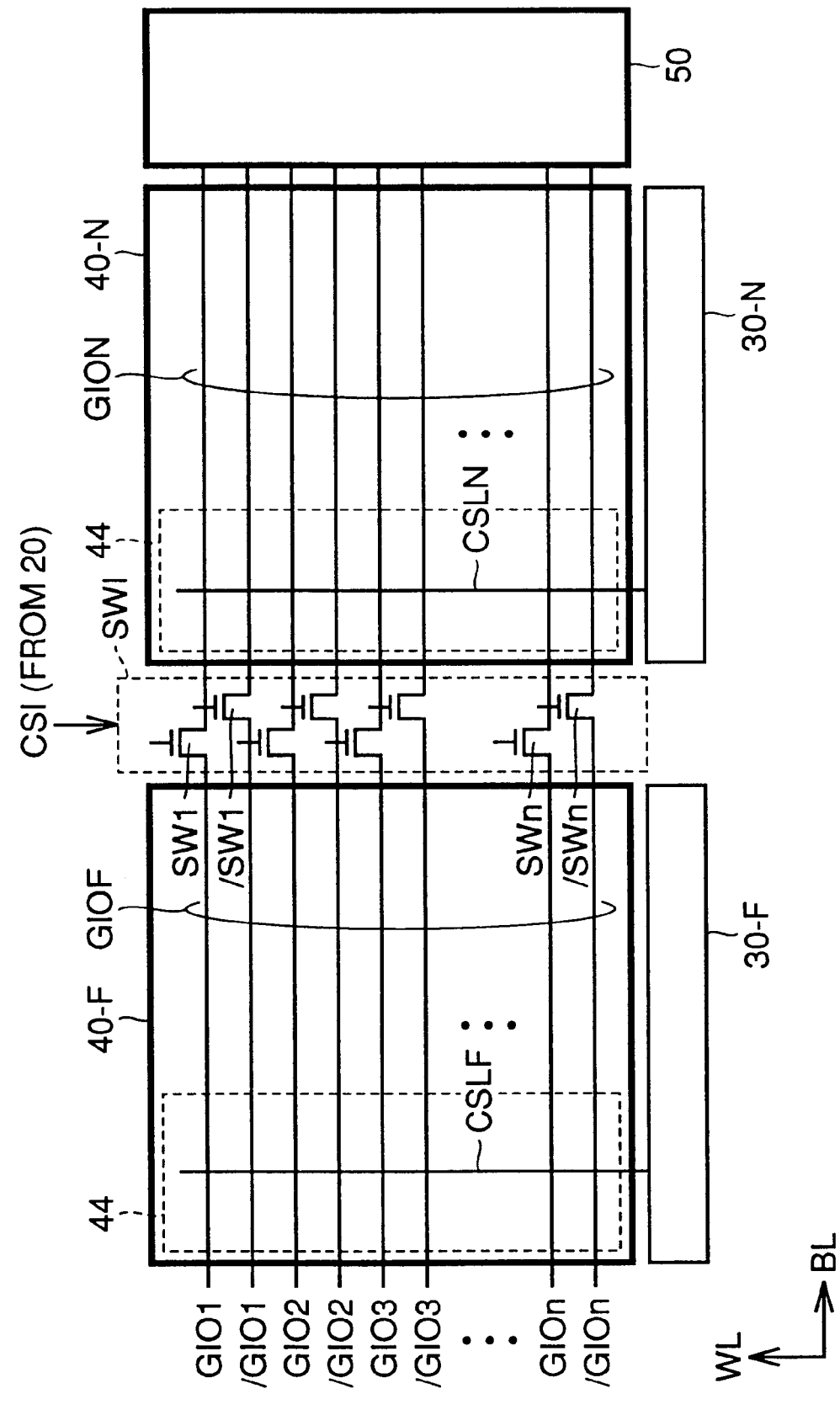
FIG. 5 is a conceptual diagram illustrating the arrangement of pairs of global data I/O lines in the memory cell array according to the first embodiment.

Referring to FIG. 5, the memory cell array 40 is split into a memory block 40-N near to the data input/output circuit 50 and a memory block 40F far from the data input/output circuit 50.

A switch group SWI provided between the memory blocks 40-F and 40N splits the pairs of global data I/O lines GIO1 and /GIO1 to GIOn and /GIOn provided for the overall memory cell array 40. Among the split pairs of global data I/O lines GIO1 and /GIO1 to GIOn and /GIOn, those corresponding to the memory block 40-F are collectively referred to also as pairs of global data I/O lines GIOF, and those corresponding to the memory block 40-N are collectively referred to also as pairs of global data I/O lines GION.

The switch group SWI includes switch groups SW1 and /SW1 to SWn and /SWn provided in correspondence to the pairs of global data I/O lines GIO1 and /GIO1 to GIOn and /GIOn respectively. The switch groups SW1 and /SW1 to SWn and /SWn are turned on/off in common in response to the control signal CSI generated by the control circuit 20.

Each of the memory blocks 40-F and 40-N includes at least one sense amplifier block 44 therein. The first embodiment is described with reference to a case of operating the memory blocks 40-F and 40-N as different banks, i.e., selecting these memory blocks 40-F and 40-N with bank addresses and a case of not operating the memory blocks 40-F and 40-N as independent banks but selecting the memory blocks 40-F and 40-N with arbitrary partial address bits.

The decoder circuit 30 is split into decoder circuits 30-F and 30-N corresponding to the memory blocks 40-F and 40-N respectively. Column selection lines CSLF and CSLN transmit the column selection signals in the memory blocks 40-F and 40-N respectively.

The decoder circuits 30-F and 30-N execute row-system selection in the memory blocks 40-F and 40-N respectively. Also when operating the memory blocks 40-F and 40-N as independent banks, therefore, row-system selection can be simultaneously executed in these memory blocks 40-F and 40-N. Thus, column selection is started after execution of the row-system selection, for inputting/outputting n data in/from n memory cells selected in response to the address signal.

When the memory block 40-F is subjected to reading, the switch group SWI must be turned on for transmitting read data to the data input/output circuit 50. When the memory block 40-N is subjected to reading, data can be transmitted to the data input/output circuit 50 while keeping the switch group SWI off.

According to the first embodiment, column selection in the memory block 40-F far from the data input/output circuit 50 is started precedently to that in the memory block 40-N near to the data input/output circuit 50 thereby speeding up data reading while turning off the switch group SWI.

First, column selection in the memory block 40-N is started through the column selection line CSLF at a timing preceding definition of memory block selection while keeping the switch group SWI off. It is an important point that column selection in the memory block 40-F far from the data input/output circuit 50 can be started regardless of whether the memory block 40-F or the memory block 40-N is subjected to reading. So far as the switch group SWI is kept off, data read from the memory block 40-F on the pairs of global data I/O lines GIOF exert no influence on the pairs of global data I/O lines GION arranged on the memory block 40-N also when the memory block 40-N is subjected to reading and column selection is executed therein.

Thereafter the control signal CSI decides an ON/OFF state of the switch group SWI due to the timing defining memory block selection.

When the memory block 40-N near to the data input/output circuit 50 is selected, column selection through the column selection line CSLN is started after memory block selection is defined. In this case, the switch group SWI is kept off also after definition of memory block selection, so that column selection is executed through the column selection line CSLN for transmitting data from a memory cell corresponding to a column signal input in the memory block 40-N to the data input/output circuit 50 through the pairs of global data I/O lines GION.

The data read time can be reduced for speeding up access by precedently executing column selection in the memory block 40-F far from the data input/output circuit 50 due to the aforementioned structure. Also when relatively delaying the column selection start timing in the memory block 40-N near to the data input/output circuit 50, the time for data propagation through the pairs of global data I/O lines GION may be short and hence the data read time can consequently be uniformalized regardless of whether the memory block 40-F or the memory block 40-N is selected. Thus, the access can be speeded up due to the improvement of the speed for reading data from the memory block 40-F far from the data input/output circuit 50. While data reading from each memory block has been described in the above, on-off control of the switch group SWI and the column selection timing in each memory block are similar to the above also with reference to data writing, and hence redundant description is not repeated.

Figure 6:
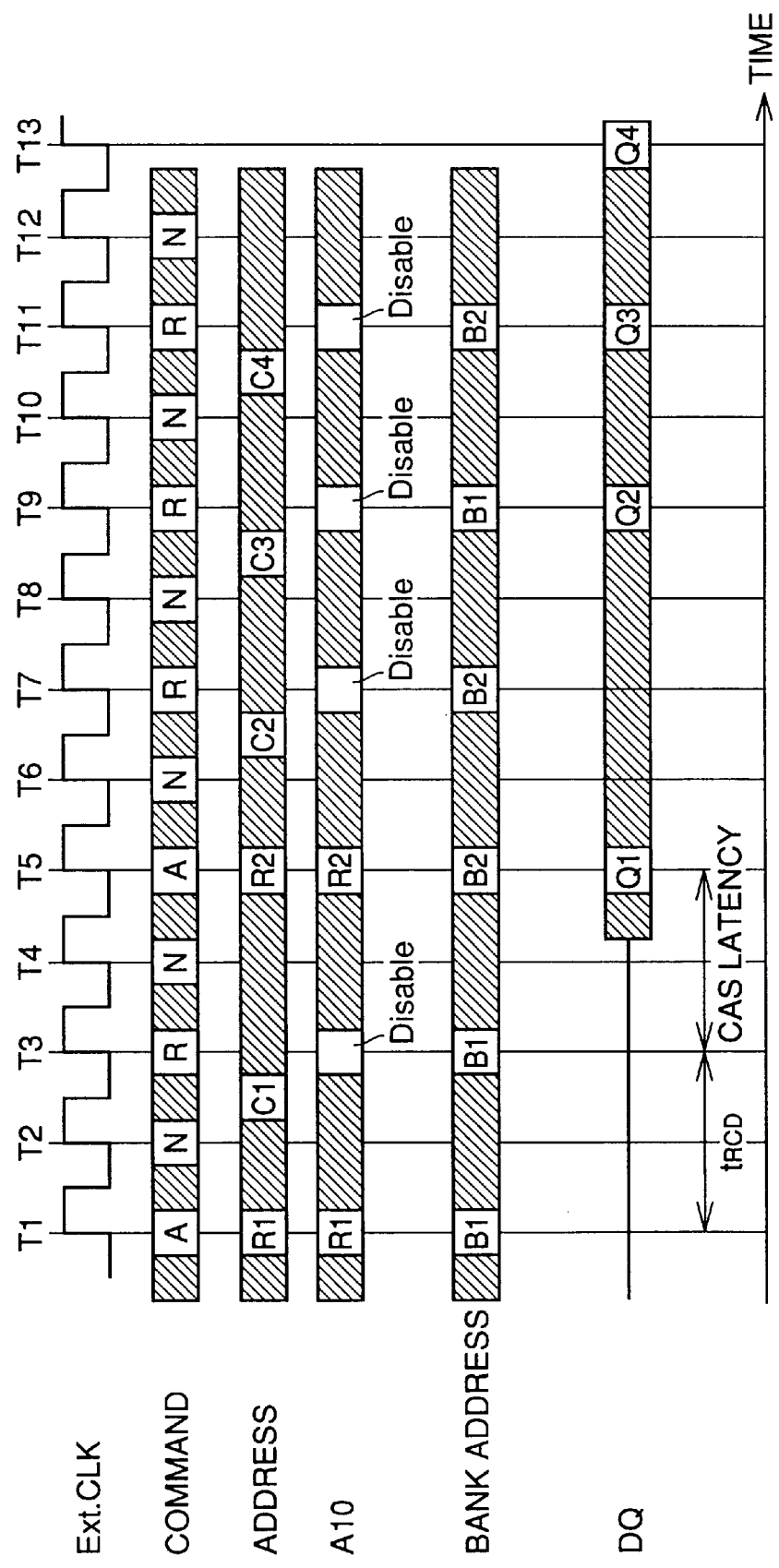
FIG. 6 is a timing chart illustrating overall operations of the semiconductor memory device 1 according to the first embodiment.

FIG. 6 shows overall operations of the semiconductor memory device 1 according to the first embodiment in the case of operating the memory blocks 40-F and 40-N as independent banks. In this case, the input bank address signal specifies whether to select a bank B1 or a bank B2. It is assumed that the memory block 40-F is selected when the bank address signal specifies the bank B1 and the memory block 40-N is selected when the bank address signal specifies the bank B2.

Referring to FIG. 6, the external clock signal Ext.CLK repeats active and inactive states in a constant cycle. The control circuit 20 generates commands responsive to combinations of signal levels of the command control signals on respective leading edges (hereinafter referred to also as clock edges) at times T1 to T13. Referring to FIG. 6, symbol A denotes an activation command, symbol N denotes no operation and symbol R denotes a read command.

With the activation command A, a row corresponding to the row address is activated in the bank specified through the bank address signal. With no operation N, no command is generated in particular. With the read command R, data is read from a memory cell responsive to the input address signal.

On the clock edge at the time T1, a row address R1 specified by the address signal including the address bit A10 and the bank address signal are input for generating the activation command A. Thus, a row corresponding to the row address R1 is activated in the bank B1.

On the clock edge at the time T2, no command is generated in particular.

A column address C1 is captured before the next clock edge T3. In the DRAM/logic merged memory, the column address C1 is generally read precedently to the clock edge at the time T3. Particularly with the read command R, there is a small possibility of inconvenience such as data destruction in the memory cells and hence such look-ahead reading of the column address C1 is positively executed in order to speed up the operations.

On the clock edge at the time T3, the read command R is generated and the bank address signal is input for starting a read operation corresponding to the row address R1 and the column address C1 in the bank B1. At the time T3, further, the address bit A10 is disabled and auto-precharging is instructed for data lines including the global data I/O lines. A CAS latency in the semiconductor memory device 1 is two clock cycles, and read data Q1 corresponding to the read command R generated at the time T3 is output on the clock edge at the time T5.

At the time T5, a bank address signal (B2 is selected) and a row address R2 are captured for executing the next read command R, and the activation command A is generated. A column address C2 is captured before the clock edge at the time T7, and a read command R corresponding to the row address R2 and the column address C2 in the bank B2 are generated at the time T7. In correspondence to this, a read data Q2 is output at the time T9 after a lapse of two clock cycles.

A read command R is generated for the bank B1 on the clock edge at the time T9, and a column address C3 is input before the clock edge at the time T9. In response to this, read data Q3 corresponding to the row address R1 and the column address C3 in the bank B1 is output on the clock edge at the time T11 after a lapse of two clock cycles, corresponding to the CAS latency, from the time T9.

A column address C4 is input before the clock edge at the time T11, and capture of the bank address signal (B2 is selected) and generation of a read command R are executed at the time T11. In correspondence to this, a read operation corresponding to the row address R2 and the column address C4 is executed in the bank B2, and corresponding read data Q4 is output at the time T13 after a lapse of two clock cycles, corresponding to the CAS latency, from the time T11.

Speedup of data reading in the memory cell array according to the first embodiment of the present invention is now described.

Figure 7:
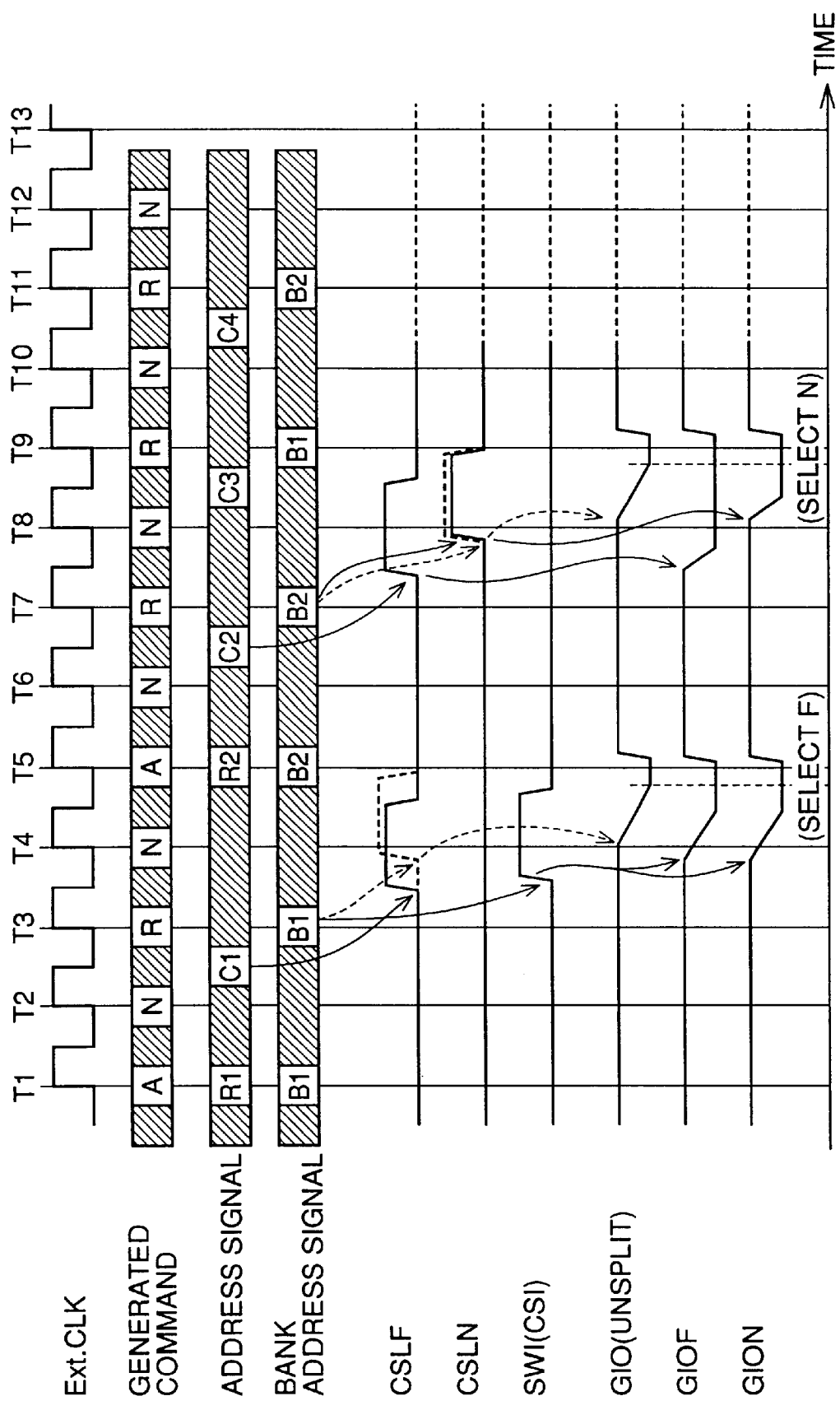
FIGS. 7 and 8 are first and second timing charts illustrating operations related to read commands in the memory cell array according to the first embodiment.

FIG. 7 shows the case where the memory blocks 40-F and 40-N shown in FIG. 5 independently operate as the banks B1 and B2 respectively.

Referring to FIG. 7, dotted lines show column selection (hereinafter also referred to as a general operation) started after definition of a selected bank without providing split points on the global data I/O lines.

Referring to FIG. 7, the bank address is input and selection of the memory block 40-F (corresponding to the bank B1) far from the data input/output circuit 50 is defined, and column selection is started at a time T3 in the general operation. Therefore, the column selection line CSLF is activated at the timing shown by the dotted line for transmitting activated column selection signals. In response to this activation of the column selection line CSLF, data reading is executed on the pair of global data I/O lines GIO provided with no split point by the switch group SWI.

According to the first embodiment, column selection in the memory block 40-F (bank B1) is started in response to the column address C1 input precedently to the clock edge at the time T3. Selection of the memory block 40-F (bank B1) is defined by input of the bank address signal on the clock edge at the time T3 and the control signal CSI is activated for turning on the switch group SWI in response to the selection of the memory block 40-F.

The control signal CSI is activated at the same timing as that for starting column selection in the general operation, while actual column decoding is separated from on-off control of the switch group SWI in the first embodiment of the present invention and hence the control signal CSI can be generated precedently to the activation timing for the column selection line CSLF in the general operation.

In response to the ON state of the switch group SWI, data of an activated pair of bit lines corresponding to the column selection signal transmitted by the column selection line CSLF are transmitted to the pairs of global data I/O lines GIOF and GION connected by the switch group SWI. Consequently, data reading in the memory block 40-F far from the data input/output circuit 50 can be speeded up by bringing forward the timing for starting column selection.

A read operation performed when the memory block 40-N (bank B2) near to the data input/output circuit 50 is selected is now described.

While the bank address signal (B2 is selected) is input on the clock edge at the time T7 for defining selection of the memory block 40-N, column selection in the memory block 40-F is started in response to input of the column address C2 and the column selection line CSLF is activated before definition of memory block selection in the first embodiment of the present invention, as hereinabove described. In response to this, data are read on the pair of global data I/O lines GIOF corresponding to the memory block 40-F. However, the control signal CSI turns off the switch group SWI and hence the read data exert no influence on the memory block 40-N.

The bank address signal (B2 is selected) is input on the clock edge at the time T7 for starting column selection in the memory block 40-N (bank B2) in response to the definition of memory block selection. Therefore, the timing for starting column selection in the memory block 40-N, i.e., the timing for activating the column selection line CSLN is similar to that in the general operation.

While read data is propagated to the pair of global data I/O lines GION in response to the activation of the column selection line CSLN, data transmission to the pair of global data I/O lines GION is executed while keeping the switch group SWI off according to the first embodiment. Thus, the parasitic capacitance of the pair of global data I/O lines GION in this state is half that of a conventional pair of global data I/O lines.

Also when starting column selection in the memory block 40-N at the same timing, therefore, read data can be transmitted to the data input/output circuit 50 at a higher speed.

Whether the memory block 40-F or the memory block 40-N is selected, the time required for data reading can be reduced as compared with that in the general operation for contributing to speedup of access, as hereinabove described.

The case where the memory blocks 40-F and 40-N split by the switch group SWI operate as the same bank is now described with reference to FIG. 8.

Figure 8:
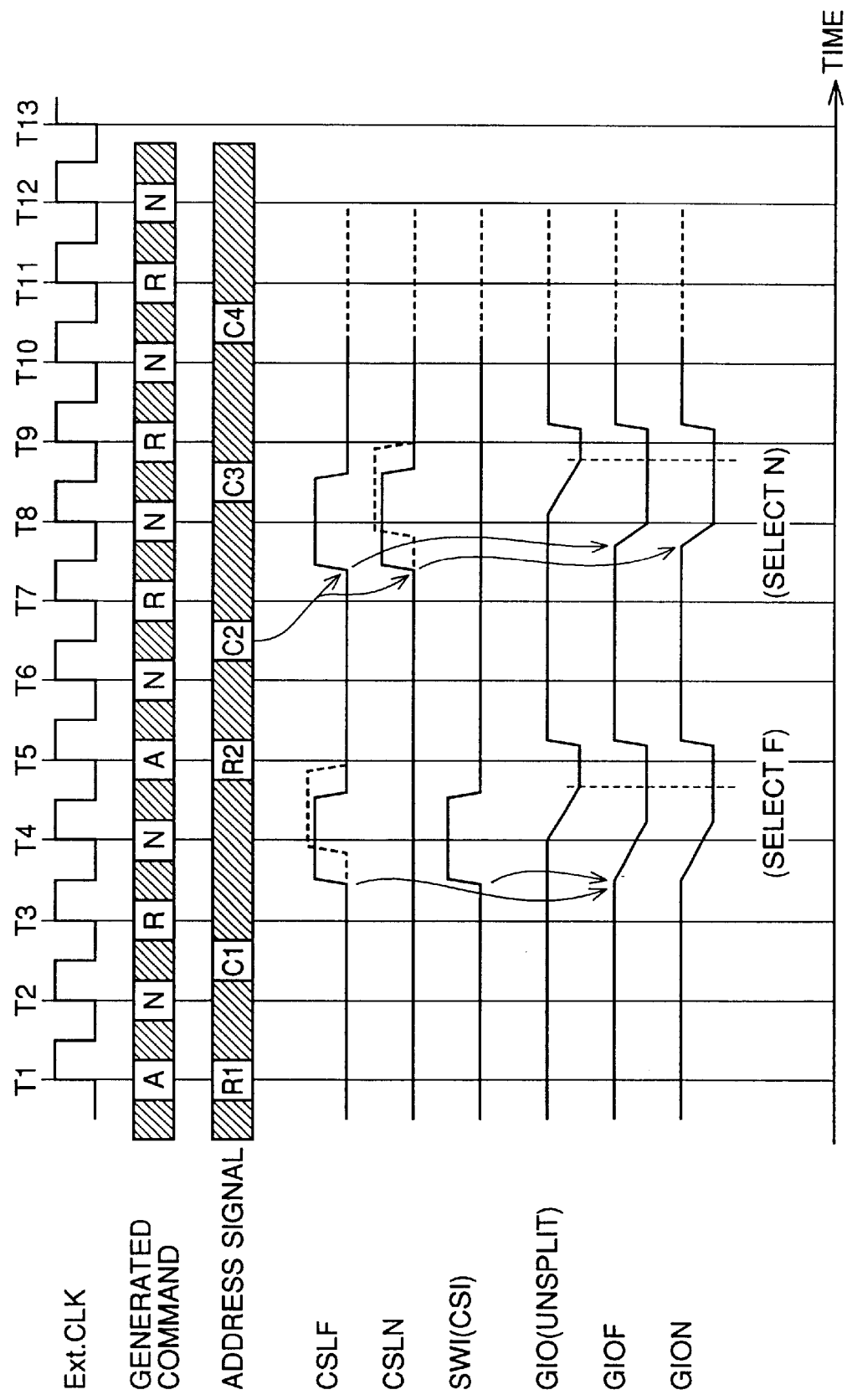

Referring to FIG. 8, no bank address is input in the case of operating the memory blocks 40-F and 40-N as the same bank requiring no selection with any bank address. FIG. 8 also shows timings of column selection in the general operation.

Also in the case shown in FIG. 8, activation commands A are generated on the clock edges at times T1 and T5 for activating the row corresponding to the row address R1 in the memory block 40-F at the time T1 and activating the row corresponding to the row address R2 in the memory block 40-N in place of the row address R1 at the time T5. Input timings for the column addresses C1, C2, C3 and C4 and generation of commands on the respective clock edges are similar to those in FIG. 7, and hence redundant description is not repeated.

When the memory blocks 40-F and 40-N operate as the same bank, the timing for turning on the switch group SWI can be brought forward as compared with that in FIG. 7.

More specifically, the control signal CSI controlling the switch group SWI can be generated at a timing completing input of the address signal, i.e., the input timing for the column address C1 preceding the time T3 before input of the bank address signal on the clock edge at the time T3 in the case shown in FIG. 7.

Therefore, data reading onto the pairs of global data I/O lines GIOF and GION can be further speeded up as compared with the general operation shown by the dotted lines.

Also in the case of selecting the memory block 40-N near to the data input/output circuit 50, the ON/OFF state of the switch group SWI can be specified when the column address C2 is input before the time T7, whereby column selection can be started at a timing similar to that in the case of selecting the memory block 40-F.

Data reading is similarly executed while keeping the switch group SWI off, whereby both of the effect of bringing forward the column selection timing and the effect of reducing the parasitic capacitance of the pair of global data I/O lines can be attained particularly when selecting the memory block 40-N. Thus, data reading can be executed in an earlier stage as compared with the case described with reference to FIG. 7, for further speeding up the access.

While the memory cell array 40 is split into two blocks in the first embodiment, the access can be similarly speeded up also when splitting the memory cell array 40 into three or more memory blocks by properly arranging the data input/output circuit 50 (in plural as the case may be) and precedently executing column selection for the memory block farthest from the data input/output circuit 50 after turning off all switch groups arranged between the memory blocks.

Second Embodiment

A second embodiment of the present invention is described with reference to reduction of power consumption by splitting pairs of global data I/O lines.

In the second embodiment, reduction of power consumption based on the structure of the memory cell array 40 described with reference to FIG. 5 is first considered.

Figure 9:
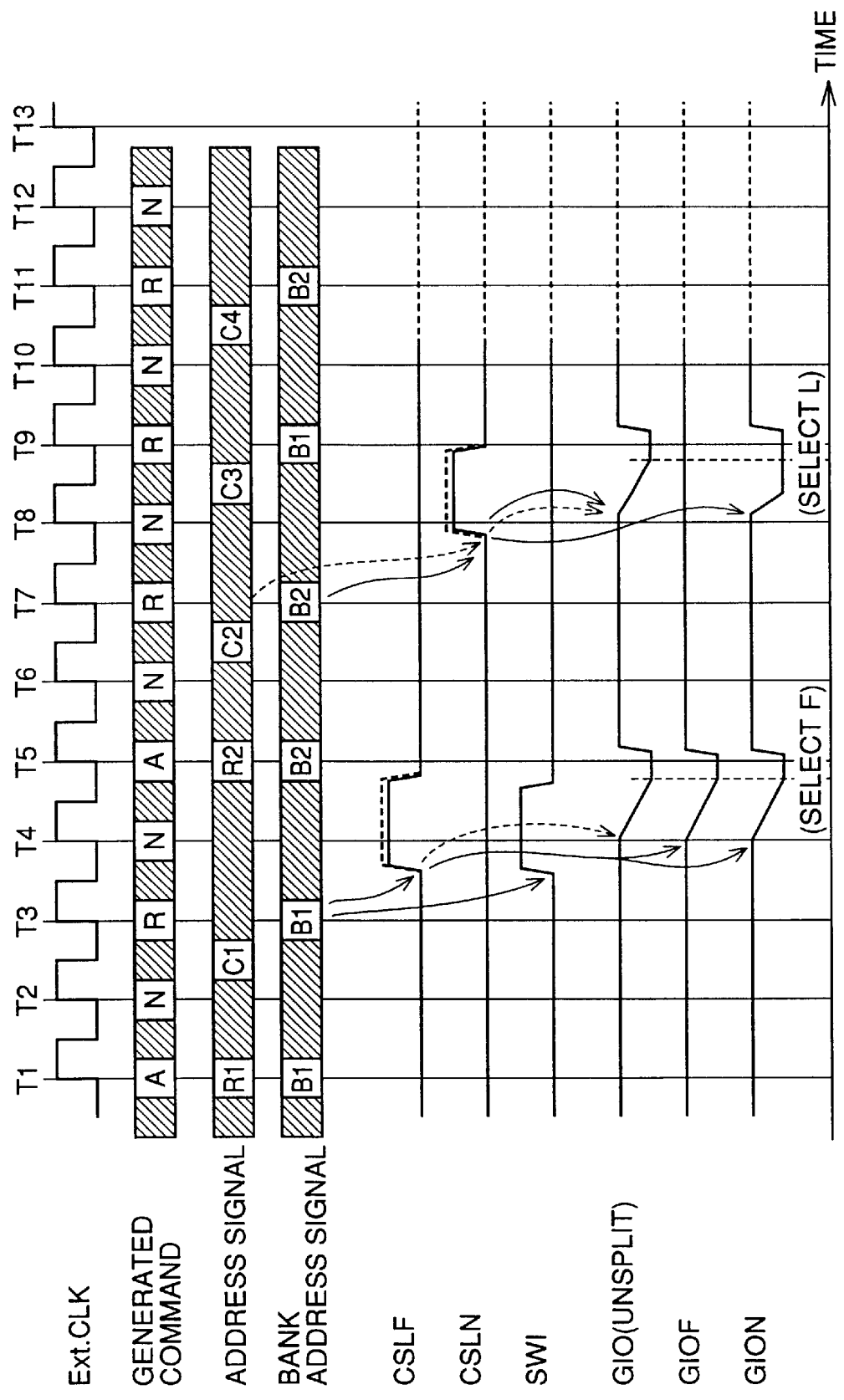
FIGS. 9 and 10 are first and second timing charts illustrating operations related to read commands in a memory cell array according to a second embodiment of the present invention.

FIG. 9 is a timing chart, showing the case where memory blocks 40-F and 40-N operate as independent banks, associated with the timing chart described with reference to FIG. 7.

Referring again to FIG. 7, column selection in the memory block 40-F is started in the first embodiment before memory block selection, i.e., bank selection is defined in order to speed up data reading from the memory block 40-F far from the data input/output circuit 50. Whether the memory block 40-F or the memory block 40-N is selected, therefore, column selection is executed in the memory block 40-F to consume power for driving the pairs of global data I/O lines GIOF arranged in the memory block 40-F.

Referring to FIG. 9, column selection in each memory block is executed when bank selection is completed according to the second embodiment, in order to avoid useless power consumption. Also when the memory block 40-F (bank B1) is selected, column selection is started upon input of a bank address on a clock edge at a time T3 similarly to a general operation shown by a dotted line. Therefore, data transmission to pairs of global data I/O lines GIOF and GION remains unchanged.

When a bank B2 corresponding to the memory block 40-N is selected, column selection in the memory block 40-N is started at a timing identical to that shown in FIG. 7 while transmission of read data to the pair of global data I/O lines GION is executed while keeping a switch group SWI off. Thus, the parasitic capacitance of the pair of global data I/O lines GION can be halved as compared with that in the general operation, to reduce power consumption. Data reading is also speeded up following this.

In this case, no column selection is executed in the memory block 40-F and a column selection line CSLF is not activated, and hence the pair of global data I/O lines GIOF are not driven for data transmission. As compared with the case of FIG. 7, therefore, power consumption can be reduced when selecting the memory block 40-N.

Figure 10:
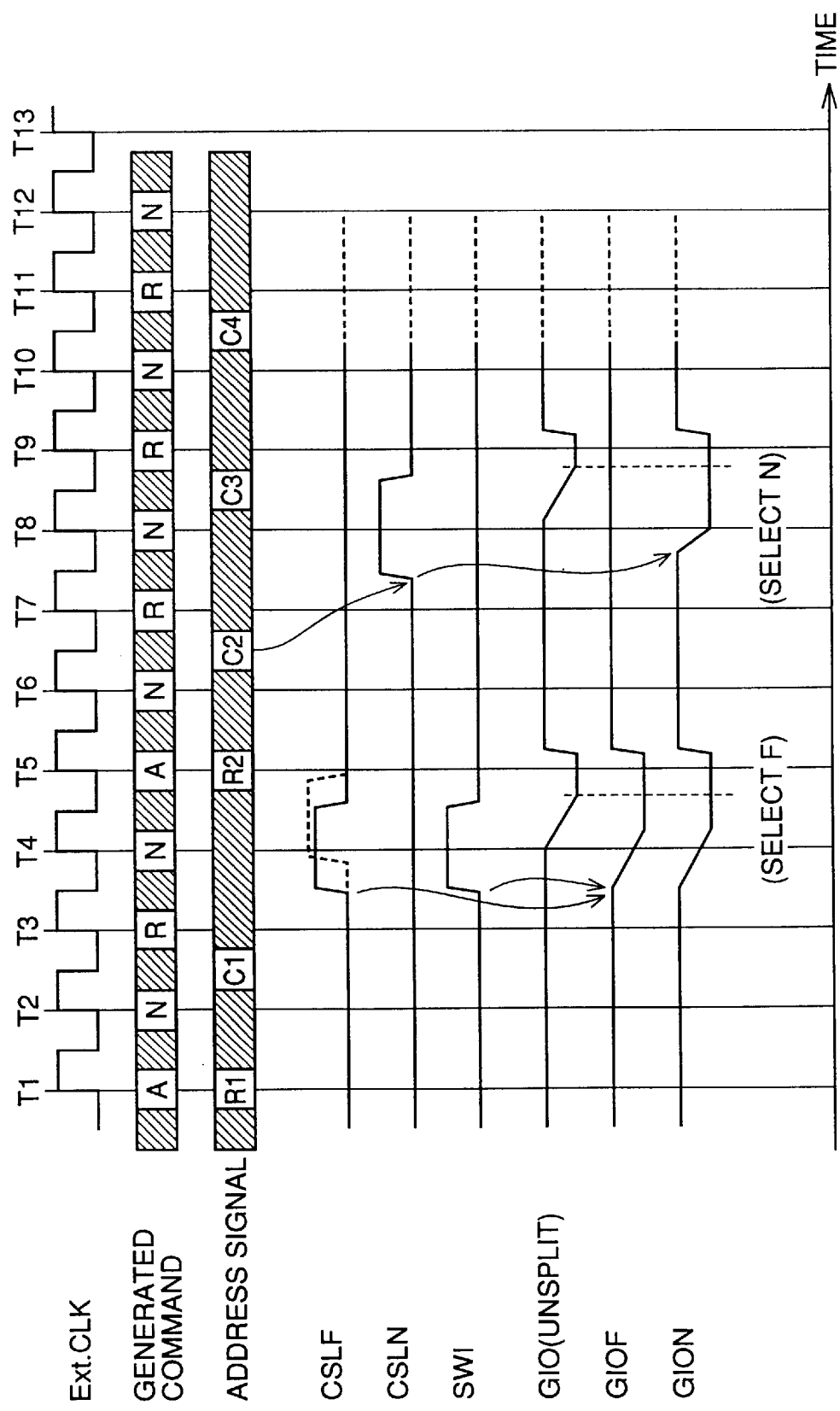

FIG. 10 is a timing chart, showing the case where the memory blocks 40-F and 40-N shown in FIG. 5 operate as the same bank, associated with the timing chart described with reference to FIG. 8.

The timing chart shown in FIG. 10 is different from that shown in FIG. 8 in a point that no column selection is executed, i.e., the column selection line CSLF is not activated in the memory block 40-F when the memory block 40-N near to a data input/output circuit 50 is selected.

Referring to FIG. 10, column selection corresponding to a read command R for the memory block 40-F generated on a clock edge at a time T3 is similar to that in FIG. 8, and hence redundant description is not repeated.

A read command R for the memory block 40-N generated on a clock edge at a time T7 is now considered. While column selection is started in both of the memory blocks 40-F and 40-N when the row address R2 and the column address C2 are completely input in the case shown in FIG. 8, either memory block 40-F or 40-N can be selected for executing column selection when the memory block 40-F or 40-N can be selected only with an address signal without any bank address signal.

In the timing chart shown in FIG. 10, therefore, activation of the column selection line CSLF corresponding to the memory block 40-F executed in FIG. 8 is not executed when the memory block 40-N is selected. Thus, the pair of global data I/O lines GIOF corresponding to the memory block 40-F are not driven for data transmission but kept at a precharge potential. When the memory block 40-N is selected, therefore, the pair of global data I/O lines GIOF corresponding to the non-selected memory block 40-F do not wastefully consume power but power consumption can be reduced.

Thus, when memory block selection is enabled only with an address signal input precedently to input of a bank address signal, a multi-data I/O line structure capable of compatibly speeding up data reading and reducing power consumption can be employed as described with reference to FIG. 10.

Modifications of the second embodiment are now described with reference to different split modes of memory blocks and pairs of global data I/O lines in the memory cell array 40.

First Modification of Second Embodiment

Figure 11:
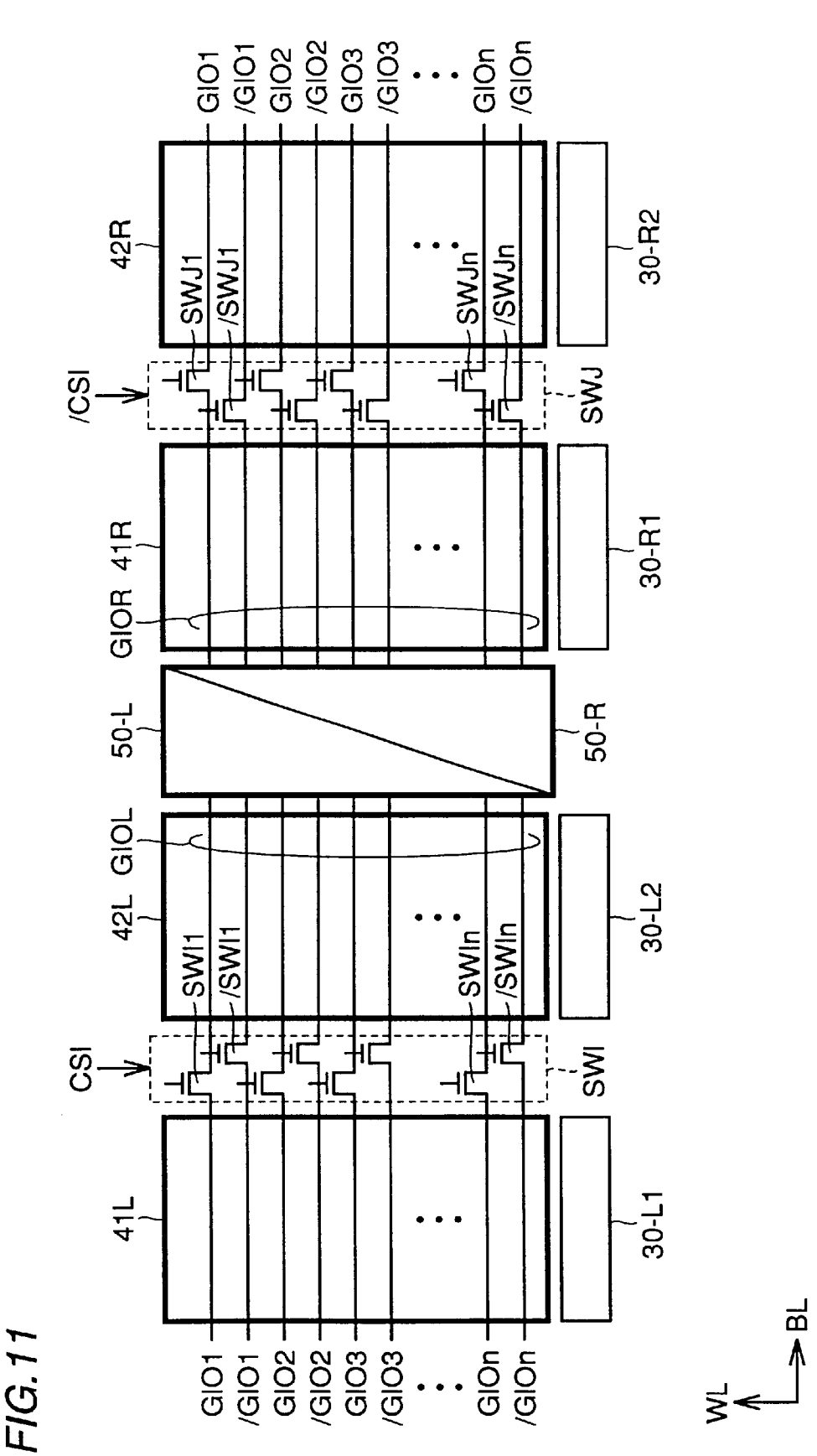
FIG. 11 is a conceptual diagram showing the structure of a memory cell array and the arrangement of pairs of global data I/O lines according to a first modification of the second embodiment.

Referring to FIG. 11, a memory cell array 40 according to a first modification of the second embodiment is split into left and right regions through data input/output circuits 50-L and 50-R. Switch groups SWI and SWJ further split the memory cell array 40 into memory mats 41L and 42L and memory mats 41R and 42R in the left and right regions respectively. The memory mats 41L and 41R form the same memory block 41, and the memory mats 42L and 42R form the same memory block 42. Similarly to the first embodiment, the memory blocks 41 and 42, capable of executing independent bank operations, can be selected by inputting a bank address signal.

A control signal CSI turns on/off the switch group SWI arranged between the memory mats 41L and 42L and a complementary signal /CSI of the control signal CSI controls the switch group SWJ arranged between the memory mats 41R and 42R, while the switch groups SWI and SWJ are complementarily turned on/off.

Therefore, the switch group SWI may be turned on while turning off the switch group SWJ for selecting the memory block 41 with an input address signal or both of the address signal and a bank address signal, and the switch group SWJ may be turned on while turning off the switch group SWI for selecting the memory block 42.

Decoding circuits 30-L1 and 30-R1 arranged for the memory block 41 execute column selection at the same timing. Similarly, decoding circuits 30-L2 and 30-R2 also execute column selection at the same timing. Column selection in the memory blocks 41 and 42 and control of the switch groups SWI and SWJ may be executed while associating the memory blocks 40-F and 40-N with the memory blocks 42 and 41 respectively in the timing charts described with reference to FIGS. 9 and 10.

The data input/output circuits 50-L and 50-R are arranged so that data can be read and written from and in horizontally split pairs of global data I/O lines GIOL and GIOR independently of each other.

Thus, the switch group SWJ may be turned off when the memory block 41 is selected so that the pairs of global data I/O lines GIOR may not be driven in the region corresponding to the memory mat 42R, while the switch group SWI may be turned off when the memory block 42 is selected so that the pairs of global data I/O lines GIOL may not be driven in the region corresponding to the memory mat 41L. In other words, data input/output can be executed by driving the pairs of global data I/O lines corresponding to ¾ of the regions of the overall memory cell array 40 split into the four memory mats 41L, 41R, 42L and 42R whether the memory block 41 or the memory block 42 is selected.

Consequently, power for driving the pairs of global data I/O lines GIOL and GIOR can be reduced for implementing low power consumption.

Second Modification of Second Embodiment

Figure 12:
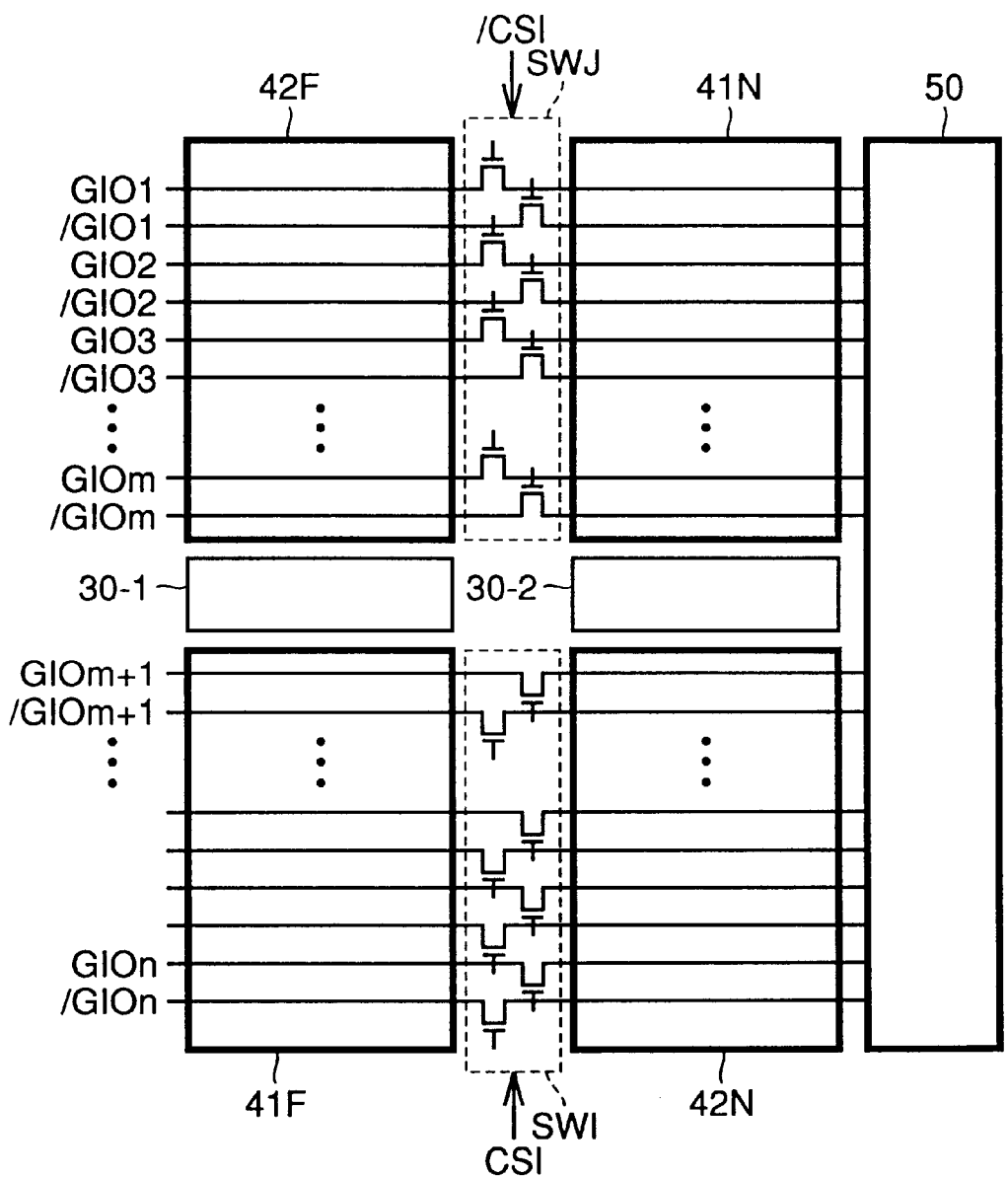
FIG. 12 is a conceptual diagram showing the structure of a memory cell array and the arrangement of pairs of global data I/O lines according to a second modification of the second embodiment.

Referring to FIG. 12, a memory cell array 40 according to a second modification of the second embodiment is split into four memory mats 41N, 42N, 41F and 42F by decoder circuits 30-1 and 30-2 and switch groups SWI and SWJ. The decoder circuits 30-1 and 30-2 are provided to split the memory cell array 40 into two regions along the column direction. The memory mats 41N and 41F form the same memory block 41, while the memory mats 42N and 42F form the same memory block 42.

Pairs of global data I/O lines GIO1 and /GIO1 to GIOm and /GIOm (m: natural number of n/2) are provided for the memory mats 42F and 41N forming one of the regions split by the decoder circuits 30-1 and 30-2 along the column direction. The switch group SWJ is provided between the memory mats 42F and 41N, for splitting the pairs of global data I/O lines GIO1 and /GIO1 to GIOm and /GIOm into two groups.

A similar structure is also applied to the memory mats 41F and 42N. Pairs of global data I/O lines GIOm+1 and /GIOm+1 to GIOn and /GIOn are provided for the memory mats 41F and 42N and split into two groups by the switch group SWI.

Similarly to the case shown in FIG. 11, control signals CSI and /CSI on-off control the switch groups SWI and SWJ. The switch group SWI is turned on and the switch group SWJ is turned off for selecting the memory block 41.

When the memory block 42 is selected, the switch group SWI is turned off and the switch group SWJ is turned on.

In order to select the memory block 41 or 42 and perform column selection in the selected memory block, column selection and control of the switch groups SWI and SWJ may be executed while associating the memory blocks 42 and 41 with the memory blocks 40-F and 40-N at the same timings as those in the timing charts shown in FIGS. 9 and 10, similarly to the first modification of the second embodiment.

Also in this structure, data can be transmitted between the memory cell array 40 and them data input/output circuit 50 by driving the pairs of global data I/O lines in ¾ of the regions of the overall memory cell array 40 split into the four memory mats 41F, 41N, 42F and 42N whether the memory block 41 or the memory block 42 is selected, whereby power consumption can be uniformly reduced.

Third Modification of Second Embodiment

Figure 13:
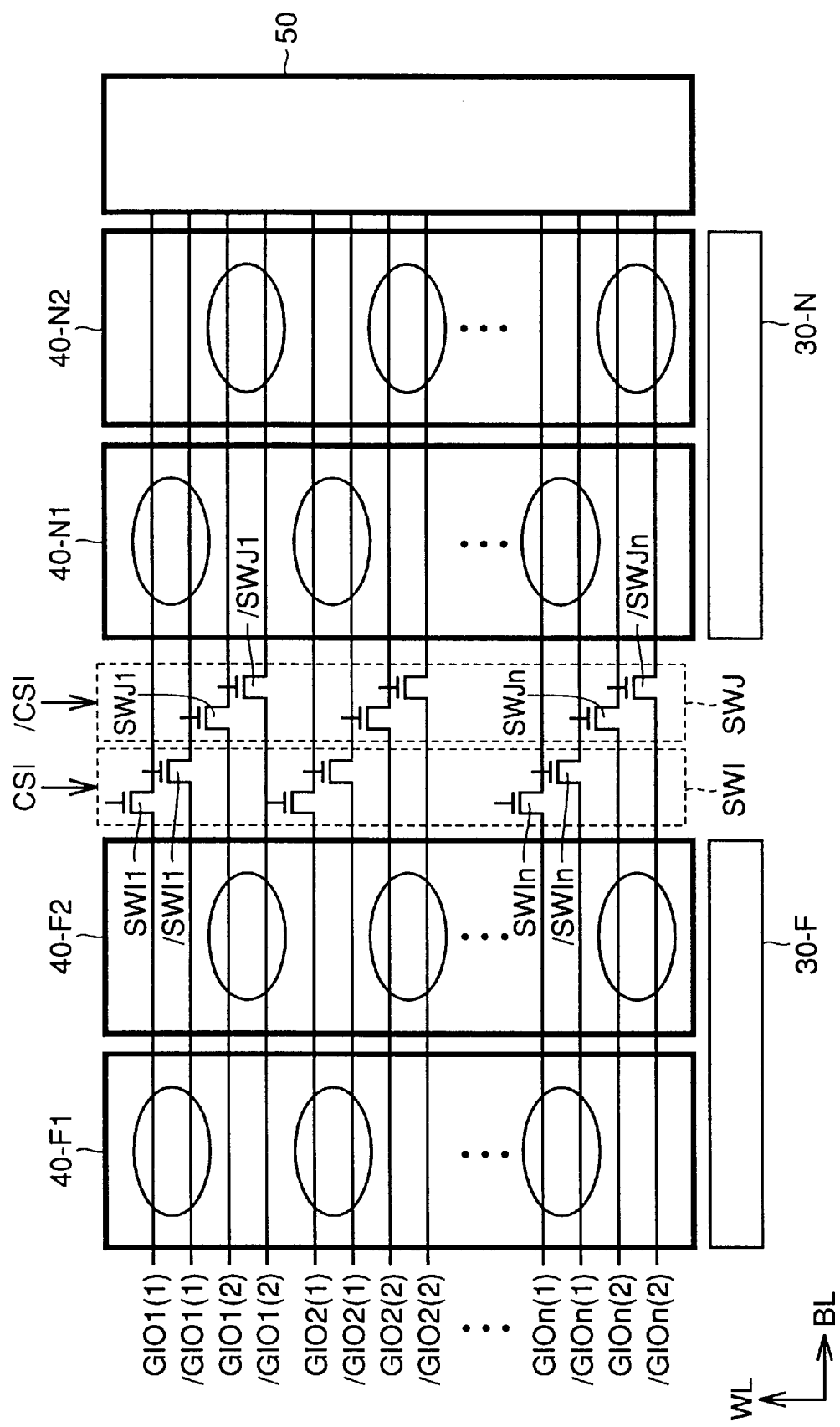
FIG. 13 is a conceptual diagram showing the structure of a memory cell array and the arrangement of pairs of global data I/O lines according to a third modification of the second embodiment.

Referring to FIG. 13, a memory cell 40 according to a third modification of the second embodiment is split into two independently operable banks provided with pairs of global data I/O lines independently of each other. More specifically, a region where switch groups SWI and SWJ are arranged splits the memory cell array 40 into regions near to and far from a data input/output circuit 50, and each region is split into two memory mats forming different banks.

Therefore, memory mats 40-F1 and 40-F2 are arranged on the region far from the data input/output circuit 50, while memory mats 40-N1 and 40-N2 are arranged on the region near to the data input/output circuit 50. The memory mats 40-F1 and 40-N1 form the same bank B1, and the memory mats 40-F2 and 40-N2 form the same bank B2.

Pairs of global data I/O lines GIO1(1) and /GIO1(1) to GIOn(1) to /GIOn(1) are arranged for the bank B1. Similarly, pairs of global data I/O lines GIO1(2) and /GIO1(2) to GIOn(2) and /GIOn(2) are arranged for the bank B2.

A decoder circuit 30-F is provided in correspondence to the memory mats 40-F1 and 40-F2, and a decoder circuit 30-N is provided in correspondence to the memory mats 40-N1 and 40-N2.

The pairs of global data I/O lines GIO1(1) and /GIO1(1) to GIOn(1) and /GIOn(1) provided in correspondence to the bank B1 are connected with pairs of bit lines in the memory mats 40-F1 and 40-N1 through column selection gates. Similarly, the pairs of global data I/O lines GIO1(2) and /GIO1(2) to GIOn(2) and /GIOn(2) provided in correspondence to the bank B2 are connected with pairs of bit lines in the memory mats 40-F2 and 40-N2 through column selection gates. Thus, the pairs of global data I/O lines GIO1(1) and /GIO1(1) to GIOn(1) and /GIOn(1) and GIO1(2) and /GIO1(2) to GIOn(2) and /GIOn(2) are provided for the banks B1 and B2 and not connected to the pairs of bit lines in the memory mats 40-F2 and 40-N2 and 40-F1 and 40-N1 belonging to the different banks B2 and B1 respectively, whereby the parasitic capacitance in each pair of global data I/O lines can be suppressed smaller as compared with the case of arranging the pairs of global data I/O lines for the overall memory cell array 40 as shown in each of the aforementioned embodiments and modifications.

Further, data input/output can be executed by driving the minimum necessary number of pairs of global data I/O lines by turning the switch groups SWI and SWJ on/off in response to a bank address signal. More specifically, the switch group SWI is turned on and the switch group SWJ is turned off when the bank B1 is selected. When the bank B2 is selected, the switch group SWJ is turned on and the switch group SWI is turned off. Thus, power consumption can be reduced by driving the minimum necessary number of data lines in response to the selected bank with the pairs of global data I/O lines reduced in parasitic capacitance due to the arrangement for the respective banks B1 and B2.

In this case, row selection and column selection can be precedently executed in each bank before input of the bank address signal. In association with the timing chart shown in FIG. 7, column selection through the decoder circuits 30-F and 30-N can be started at a timing similar to that starting column selection corresponding to the far memory block 40-F through the column selection line CSLF before input of the bank address signal. Also when the switch groups SWI and SWJ are on-off controlled after bank selection is defined through input of the bank address signal, data of the different banks do not compete on the pairs of global data I/O lines, and hence speedup of data reading and reduction of power consumption can be simultaneously attained.

Third Embodiment

A third embodiment of the present invention is described with reference to a structure of splitting each pair of global data I/O lines shared between read/write data into a pair of global write data buses GWDBP (GWDB and /GWDB) dedicated to transmission of write data and a pair of global read data buses GRDBP (GRDB and /GRDB) dedicated to transmission of read data in relation to the structure of splitting pairs of global data I/O lines described with reference to the first and second embodiments.

A memory cell array 40 according to the third embodiment is substantially similar in structure to the memory cell array 40 according to the first embodiment shown in FIG. 2, while the former is different from the latter in a point that each of pairs of global data I/O lines GIOP1 to GIOPn are split into the pair of global read data buses GRDBP and the pair of global write data buses GWDBP (not shown).

In correspondence to such splitting of the read/write data lines, a column selection gate 71 must be provided in place of the column selection gate 70.

Figure 14:
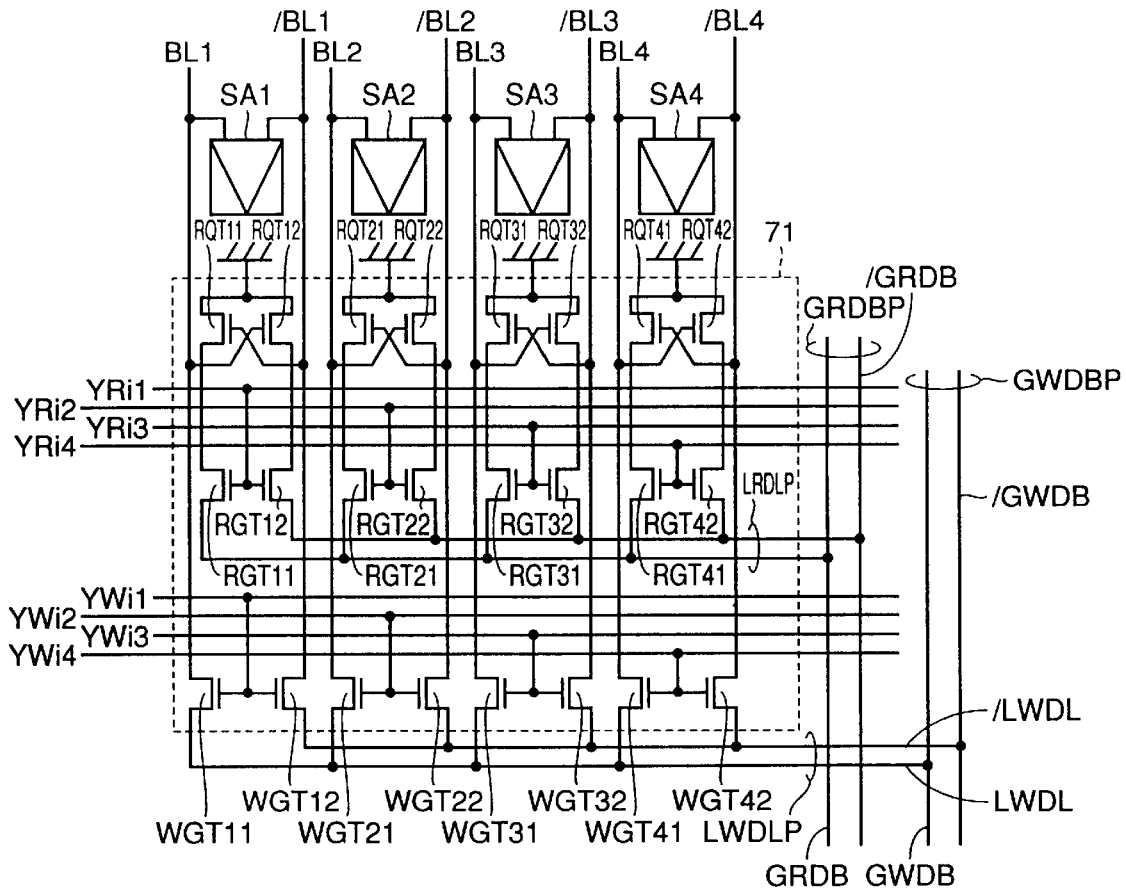
FIG. 14 is a circuit diagram showing the structure of a column selection gate 71 according to a third embodiment of the present invention.

FIG. 14 is a circuit diagram showing the structure of the column selection gate 71 according to the third embodiment.

Referring to FIG. 14, the column selection gate 71 includes read gate transistors RGT11 and RGT12 to RGT41 and RGT42 and write column selection transistors WGT11 and WGT12 to WGT41 and WGT42 provided in correspondence to pairs of bit lines BL1 and /BL1 to BL4 and /BL4 respectively. The column selection gate 71 further includes read transistors RQT11 and RQT12 to RQT41 and RQT41 coupled between the read gate transistors RGT11 and RGT12 to RGT41 and RGT42 and ground nodes respectively and having gates coupled to single ones of the pairs of bit lines BL1 and /BL1 to BL4 and /BL4.

The structure corresponding to the pair of bit lines BL1 and /BL1 is representatively described. A sense amplifier SA1 is provided for amplifying potential difference caused between the pair of bit lines BL1 and /BL1. The read transistor RQT11, having a gate coupled with the bit line /BL1, is coupled between the read gate transistor RGT11 and the ground node. The read transistor RQT12, having a gate coupled to the bit line BL1, is coupled between the ground node and the read gate transistor RGT12.

The read gate transistors RGT11 and RGT12 couple the read transistors RQT11 and RQT12 with a pair of local read data lines LRDLP respectively. The gates of the read gate transistors RGT11 and RGT12 are supplied with a column selection signal YRi1 transmitted through a column selection line.

When the column selection signal YRi1 is activated, the read gate transistors RGT11 and RGT12 are turned on due to the aforementioned structure. Further, either one of the read transistors RQT11 and RQT12 is turned on in response to the levels of signals transmitted by the bit lines BL1 and /BL1 respectively.

When the data of the bit line BL1 is high, therefore, the read transistor RQT12 is turned on so that the global read data bus /GRDB is connected with the ground node through one of the pair of local read data lines LRDLP. Thus, a voltage drop is developed on the global read data bus /GRDB and the high-level data is transmitted to the pair of global data buses GRDBP by amplifying the voltage difference caused between the pair of global read data buses GRDBP by this voltage drop. When the data on the bit line BL1 is low, a voltage drop is developed in the global read data bus GRDB and the low-level data is transmitted to the pair of global read data buses GRDBP.

In relation to data reading, the read transistors RQT21 and RQT22 to RQT41 and RQT42 and the read gate transistors RGT21 and RGT22 to RGT41 and RGT42 are similarly provided for the pairs of bit lines BL2 and /BL2 to BL4 and /BL4 for transmitting data from the pairs of bit lines BL2 and /BL2 to BL4 and /BL4 corresponding to column selection signals to the pair of global read data buses GRDBP.

Column selection in data writing is now described. The write column selection transistors WGT11 and WGT12 to WGT41 and WGT42 execute column selection in data writing. The structure for the pair of bit lines BL1 and /BL1 is representatively described. The write column selection transistor WGT11 is coupled between the bit line BL1 and a local write data line LWDL. Similarly, the write column selection transistor WGT12 is coupled between the bit line /BL1 paired with the bit line BL1 and a local data line /LWDL paired with the local data line LWDL.

The pair of local write data lines LWDL and /LWDL are connected with the pair of global write data buses GWDB and /GWDB respectively. The write column selection gate transistors WGT11 and WGT12 are turned on in response to activation of a column selection signal YWi1 supplied to the gates thereof, for transmitting write data transmitted by the pair of global write data buses GWDBP to the pair of bit lines BL1 and /BL1.

The write column selection transistors WGT21 and WGT22 to WGT41 and WGT42 are similarly provided for the pairs of bit lines BL2 and /BL2 to BL4 and /BL4 respectively for connecting the pairs of bit lines BL2 and /BL2 to BL4 and /BL4 responding to column selection signals to the pair of data buses GWDBP.

Figure 15:
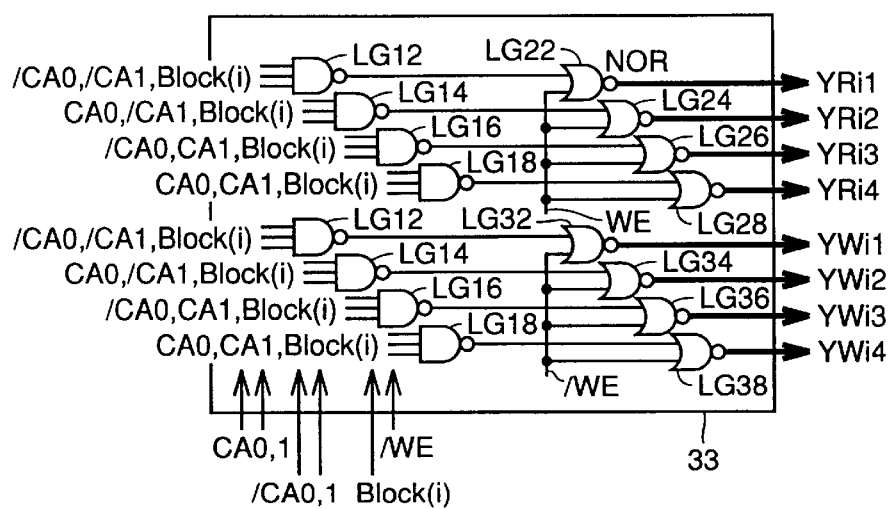
FIG. 15 is a circuit diagram showing the structure of a column decoder independently generating column selection signals in data reading and data writing.

FIG. 15 is a circuit diagram showing the structure of a column decoder 33 generating column selection signals YRi1 to YRi4 and YWi1 to YWi4. The column decoder 33 is included in a decoding circuit 30.

Referring to FIG. 15, the column decoder 33 generates the column selection signals YRi1 to YRi4 used for data reading and the column selection signals YWi1 to YWi4 used for data writing independently of each other.

The column decoder 33 is different from the column decoder 32 shown in FIG. 4 in a point that the same generates the column selection signals YRi1 to YRi4 and YWi1 to YWi4 on the basis of a write enable signal /WE in addition to column address bits CA0 and CA1 and complementary column address bits /CA0 and /CA1 and a sense amplifier block selection signal Block(i).

Similarly to the column decoder 32, the column decoder 33 has logic gates LG12 to LG18 outputting NAND results of the column address bits CA0, CA1, /CA0 and /CA1 and the sense amplifier block selection signal Block(i). The logic gates LG12 to LG18 are arranged in parallel for systems generating the column selection signals YRi1 to YRi4 and YWi1 to YWi4 in data reading and data writing respectively.

The column decoder 33 further has a logic gate LG22 outputting a NOR result of the output from the logic gate LG12 and an inverted signal WE of the write enable signal /WE, a logic gate LG24 outputting a NOR result of the output from the logic gate LG14 and the signal WE, a logic gate LG26 outputting a NOR result of the output from the logic gate LG16 and the signal WE and a logic gate LG28 outputting a NOR result of the output from the logic gate LG18 and the signal WE. The logic gates LG22 to LG28 generate the column selection signals YRi1 to YRi4 for data reading respectively.

The column decoder 33 further has a logic gate LG32 outputting a NOR result of the output from the logic gate LG12 and the write enable signal /WE, a logic gate LG34 outputting a NOR result of the output from the logic gate LG14 and the write enable signal /WE, a logic gate LG36 outputting a NOR result of the output from the logic gate LG16 and the write enable signal /WE and a logic gate LG38 outputting a NOR result of the output from the logic gate LG18 and the write enable signal /WE. The logic gates LG32 to LG38 generate the column selection signals YWi1 to YWi4 employed for data writing respectively.

Thus, any column selection signal can be activated in correspondence to a column address in a sense amplifier block specified for activation in each of data reading and data writing due to the aforementioned structure.

Figure 16:
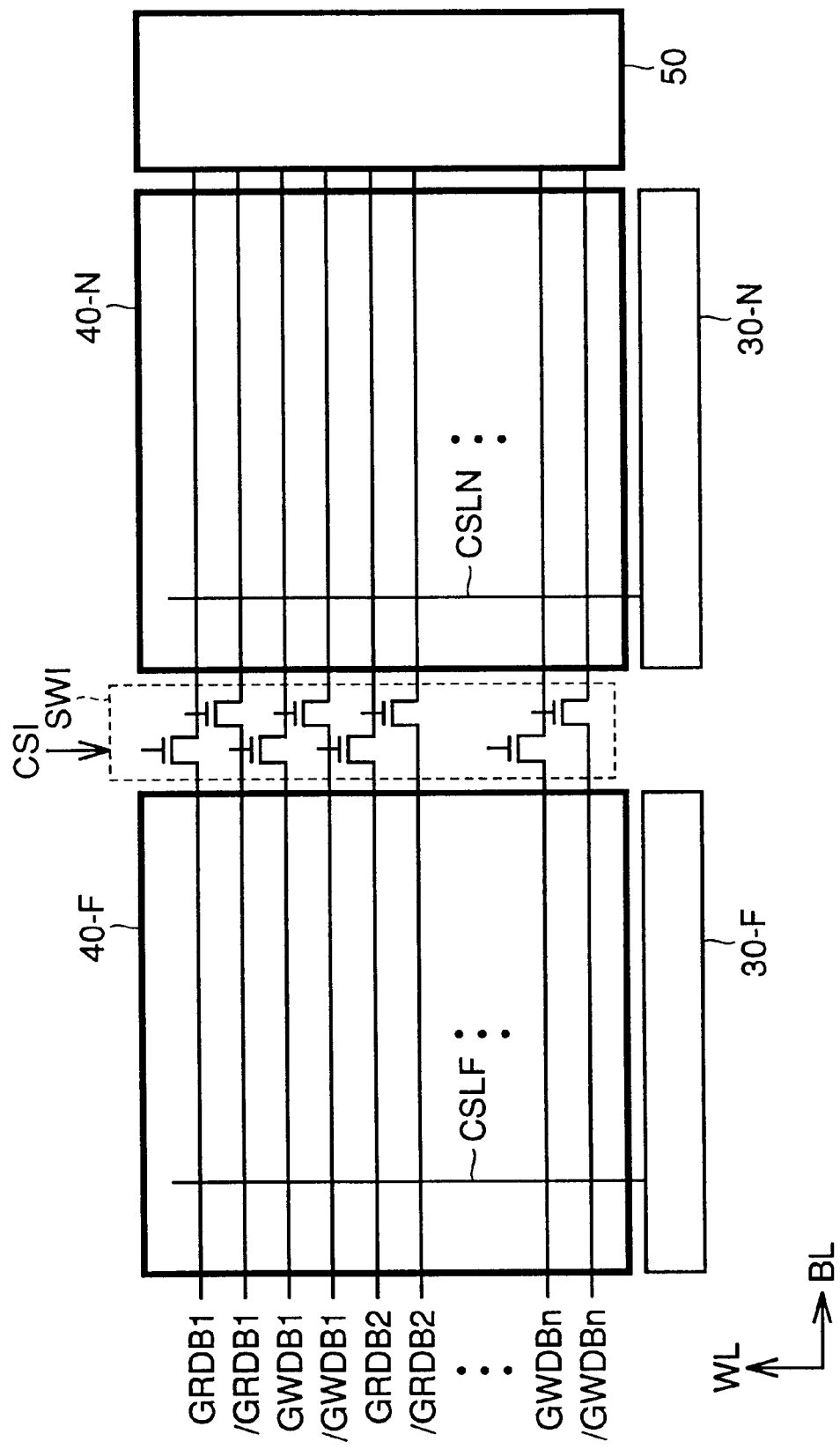
FIG. 16 is a conceptual diagram showing the structure of a memory cell array and the arrangement of pairs of global data I/O lines according to the third embodiment.

FIG. 16 shows the structure of the memory cell array and the arrangement of pairs of global data I/O lines according to the third embodiment.

The structure shown in FIG. 16 corresponds to the structure according to the first embodiment shown in FIG. 5, and a switch group SWI splits the memory cell array 40 into two memory blocks 40-F and 40-N. An effect similar to that of the first embodiment can be attained also when splitting the pairs of global data I/O lines into those for reading and those for writing by executing column selection at timings similar to those described with reference to FIGS. 8 and 9 under the aforementioned structure.

The structure shown in FIG. 16 is different from that shown in FIG. 5 in a point that each pair of global data I/O lines are split into a pair of global read data buses and a pair of global write data buses. For example, a pair of global data I/O lines GIO1 and /GIO1 are split into a pair of global read data buses GRDB1 and /GRDB1 and a pair of global write data buses GWDB1 and /GWDB1. The remaining structure and the timings for column selection are similar to those described with reference to FIGS. 5, 7 and 8, and hence redundant description is not repeated.

The structure splitting each pair of global data I/O lines into a pair of global read data buses and a pair of global write data buses can also be applied to the structure of the memory cell array 40 and the arrangement of the pairs of global data I/O lines described with reference to each of the second embodiment and the first to third modifications thereof.

Modification of Third Embodiment

Figure 17:
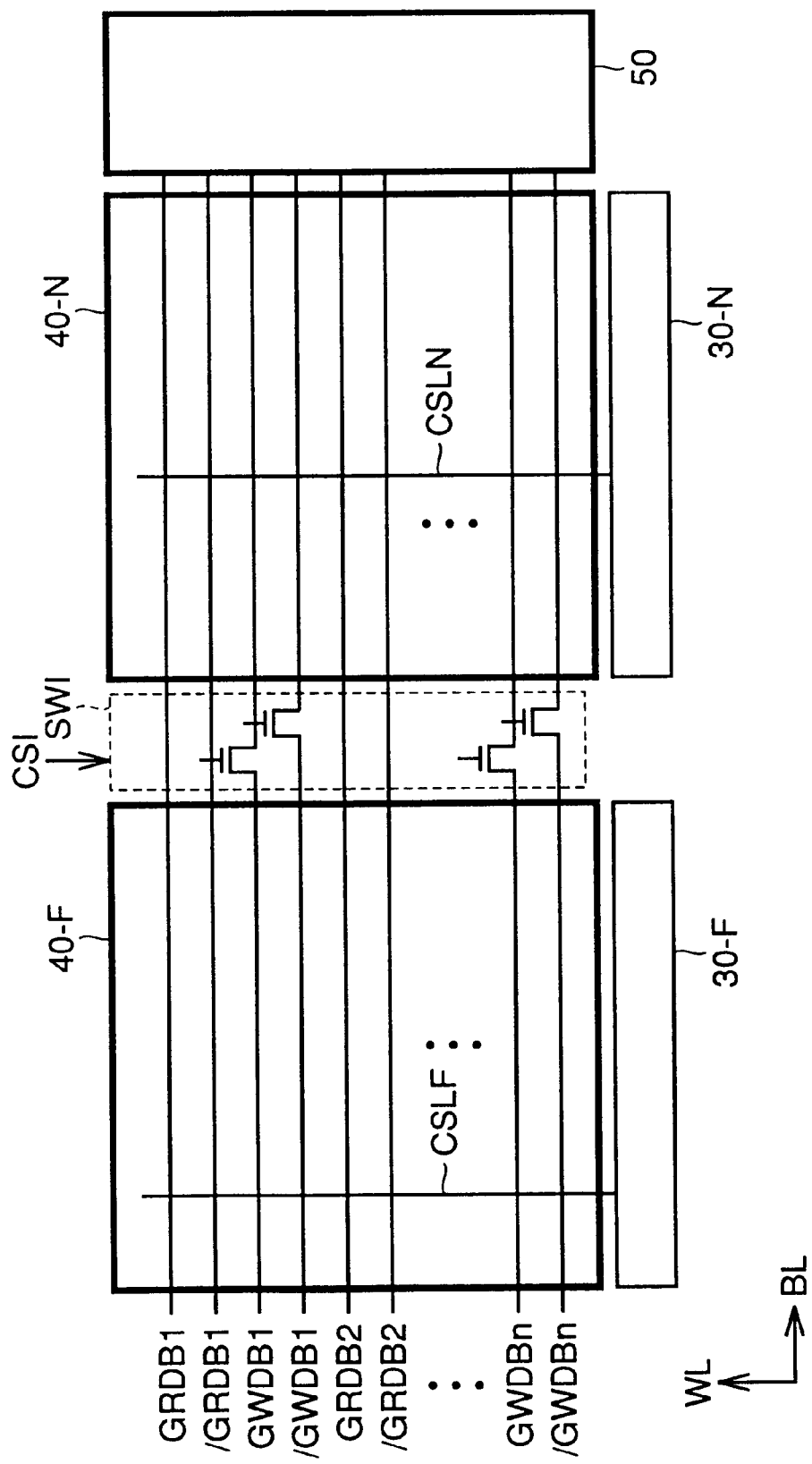
FIG. 17 is a conceptual diagram showing the structure of a memory cell array and the arrangement of pairs of global data I/O lines according to a modification of the third embodiment.

FIG. 17 shows the structure of a memory cell array and the arrangement of pairs of global data I/O lines according to a modification of the third embodiment.

Referring to FIG. 17, the structure of the memory cell array according to the modification of the third embodiment is different from the structure shown in FIG. 16 in a point that a switch group SWI is provided only for pairs of global write data buses while pairs of global read data buses are not split.

The remaining points are similar to those in FIG. 16 and hence redundant description is not repeated. As described above, data input/output corresponding to split data lines can be speeded up by splitting data lines by the switch group SWI and starting column selection in a memory block far from a data input/output circuit 50 while keeping the switch group SWI off.

The structure shown in FIG. 17 aims at balancing the access time in data writing with that in data reading by assuming that write masking is executed on the memory cell array 40 and relatively reducing a time required for data writing with respect to that required for data reading. In other words, actual data writing is executed after determining whether or not write masking is executed in the write masking and hence the start timing therefor is so limited that the data write cycle tends to be relatively long.

Therefore, the access times for data reading and data writing can be uniformalized to the utmost by providing the switch group SWI for splitting only for the global write data buses thereby precedently executing column selection and reducing a propagation time for write data in the global write data buses.

Contrarily to the structure shown in FIG. 17, a switch group for splitting can be provided only for pairs of global read data buses while not splitting global write data buses. In this case, the access times in data write and data read cycles are not uniformalized but data reading more frequently performed as compared with data writing can be more concentratively speeded up.

Fourth Embodiment

When a number of long data I/O lines are provided as in the semiconductor memory device 1 according to the present invention, coupling noises through coupling capacitances between adjacent data I/O lines come into question. When such coupling noises reduce the amplitudes of signals transmitted through the data I/O lines, the access may be delayed or a malfunction may be caused in an extreme instance.

A fourth embodiment of the present invention is described with reference to a structure for reducing coupling noises when a switch group splits pairs of global data I/O lines as described with reference to the first and second embodiments.

Figure 18:
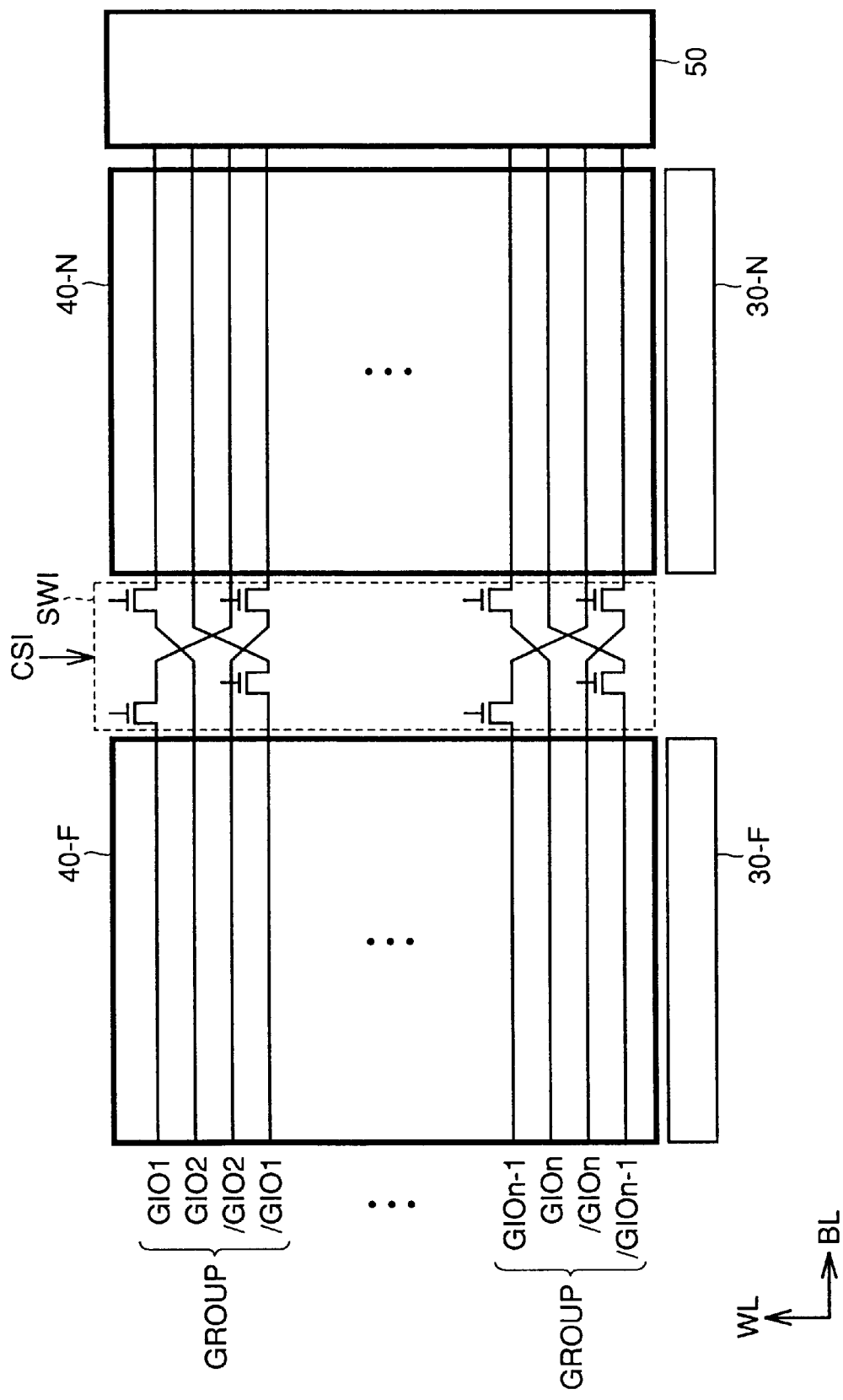
FIG. 18 is a diagram illustrating exemplary arrangement of pairs of global data I/O lines according to a fourth embodiment of the present invention.

FIG. 18 shows exemplary arrangement of pairs of global data I/O lines according to the fourth embodiment of the present invention.

Referring to FIG. 18, a memory cell array 40 is split into two memory blocks 40-F and 40-N and a switch group SWI is provided between the memory blocks 40-F and 40-N for splitting pairs of global data I/O lines, similarly to the structure shown in FIG. 5.

In the example shown in FIG. 18, the paired global data I/O lines intersect with each other on the position of the switch group SWI splitting the pairs of global data I/O lines, thereby reducing coupling noises. In other words, the pairs of global data I/O lines are split into two groups of pairs of global data I/O lines so that the paired global data I/O lines intersect with each other in each group thereby reducing coupling noises.

More specifically, the global data I/O lines are so arranged that one of data lines forming a pair of global data I/O lines is adjacent to both of complementary data lines forming another pair of global data I/O lines in the respective memory blocks 40-F and 40-N. Consequently, noises from complementary signals are canceled in the memory blocks 40-F and 40-N.

For example, a global data I/O line GIO2 shown in FIG. 18 is adjacent to another global data I/O line GIO1 paired with a global data I/O line /GIO1 in the memory block 40-F and to the global data I/O line /GIO1 transmitting data complementary to that of the global data I/O line GIO1 in the memory block 40-N. Therefore, the global data I/O line GIO2 is influenced by coupling noises from the global data I/O lines GIO1 and /GIO1 transmitting reverse signal levels in the memory blocks 40-F and 40-N respectively. Thus, noises influencing the global data I/O line GIO2 from the pair of global data I/O lines GIO1 and /GIO1 cancel each other.

Each of the remaining data lines GIO1, /GIO1 and /GIO2 is also arranged to be adjacent to two complementary data lines forming the other pair of global data I/O lines in the same group in the memory blocks 40-F and 40-N.

Thus, coupling noises between the data I/O lines can be efficiently reduced under the structure arranging the switch group SWI at the intermediate point for splitting the pairs of global data I/O lines.

As to the remaining pairs of global data I/O lines, two pairs of global data I/O lines form a group so that the data lines intersect with each other at the intermediate point provided with the switch group SWI similarly to the above.

Modification of Fourth Embodiment

Figure 19:
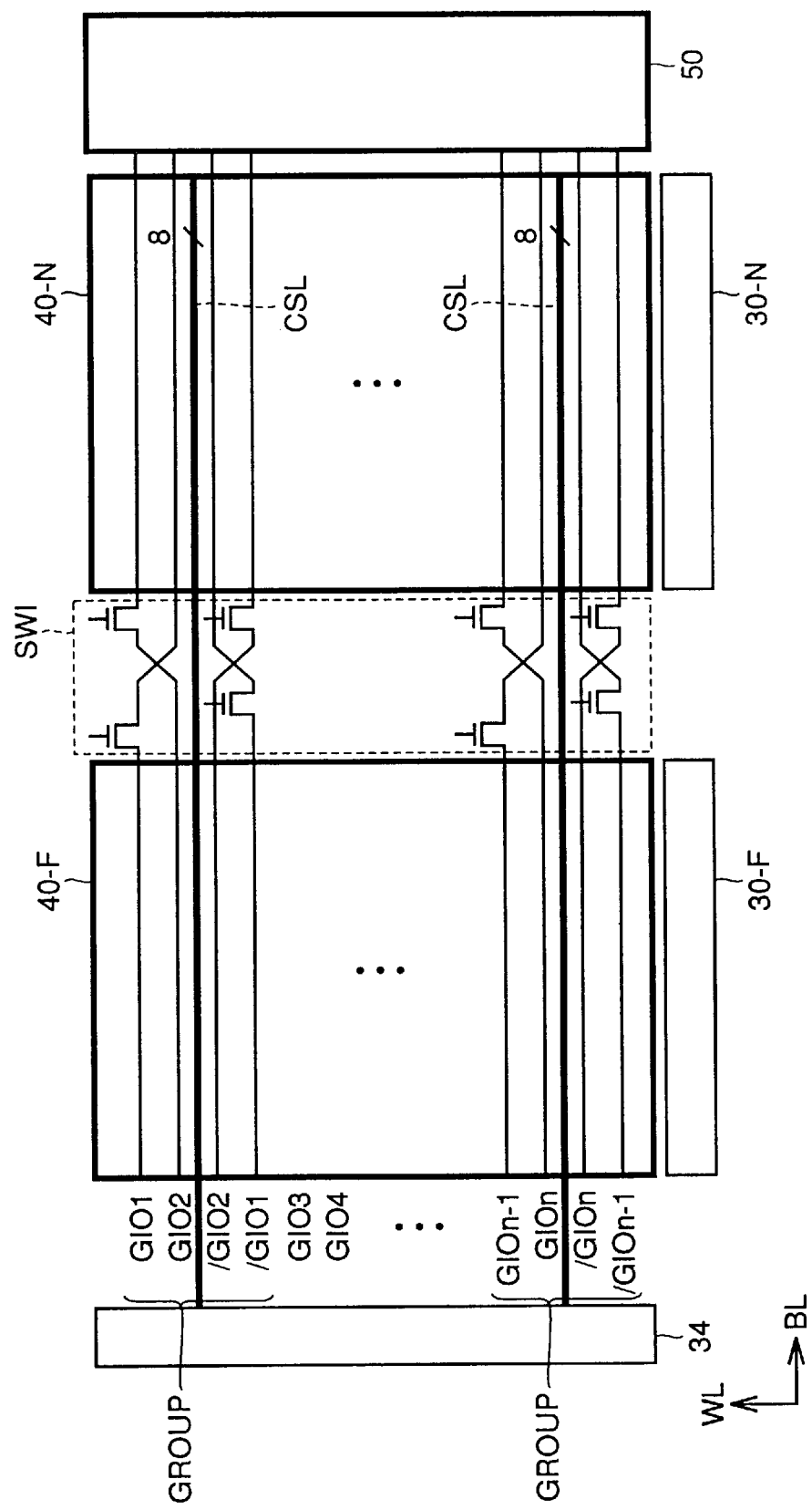
FIG. 19 is a diagram illustrating exemplary arrangement of data lines and signal lines according to a modification of the fourth embodiment.

FIG. 19 shows exemplary arrangement of data lines and signal lines according to a modification of the fourth embodiment.

The modification of the fourth embodiment is described with reference to a method of reducing coupling noises between data lines and signal lines when signal lines, such as column selection lines CSL, for example, other than data lines represented by pairs of global data I/O lines transmitting input/output data signals are provided in parallel with the pairs of global data I/O lines.

Referring to FIG. 19, the column selection lines CSL shown as representative signal lines are collectively arranged for column selection signals each corresponding to two pairs of global data I/O lines forming a group. In this modification, therefore, a pair of global data I/O lines are arranged for four memory cell columns, and hence each column selection line CSL shown in FIG. 19 is provided in correspondence to eight column selection signal lines. The column selection lines CSL are arranged in parallel with the pairs of global data I/O lines, i.e., along a bit line (BL) direction, and hence a column decoder 34 is provided independently of a decoding circuit 30.

A memory cell array is split into two memory blocks 40-F and 40-N and a switch group SWI splits each pair of global data I/O lines at an intermediate point similarly to the above description, and hence redundant description is not repeated.

Referring to FIG. 19, data lines GIO1 and GIO2 forming first ones of two pairs of global data I/O lines and data lines /GIO1 and /GIO2 transmitting data complementary to those transmitted through these data lines GIO1 and GIO2 are provided through the upper column selection line CSL.

The data lines GIO1 and GIO2 as well as the data lines /GIO1 and /GIO2 are arranged to intersect with each other on the region provided with the switch group SWI. Thus, the column selection line CSL is adjacent to the pair of global data I/O lines GIO2 and /GIO2 transmitting complementary data, in the memory block 40F. Therefore, the column selection line CSL is influenced by noises from the complementary data and hence a coupling noise on the column selection line CSL in the memory block 40-F is canceled.

Also in the memory block 40-N, the column selection line CSL is arranged to be adjacent to the pair of global data I/O lines GIO1 and /GIO1 and hence a coupling noise from the pair of global data I/O lines GIO1 and /GIO1 is canceled. On the contrary, a coupling noise from the column selection line CSL to the pairs of global data I/O lines GIO1 and /GIO1 and GIO2 and /GIO2 supplies in-phase noises to the two complementary data lines forming each of the pairs of global data I/O lines GIO1 and /GIO1 and GIO2 and /GIO2, and hence noise influence from the column selection line CSL can be eliminated as viewed from the potential difference between the pairs of global data I/O lines GIO1 and /GIO1 and GIO2 and /GIO2.

A similar structure is applied to each group of the remaining two pairs of global data I/O lines.

Figure 20:
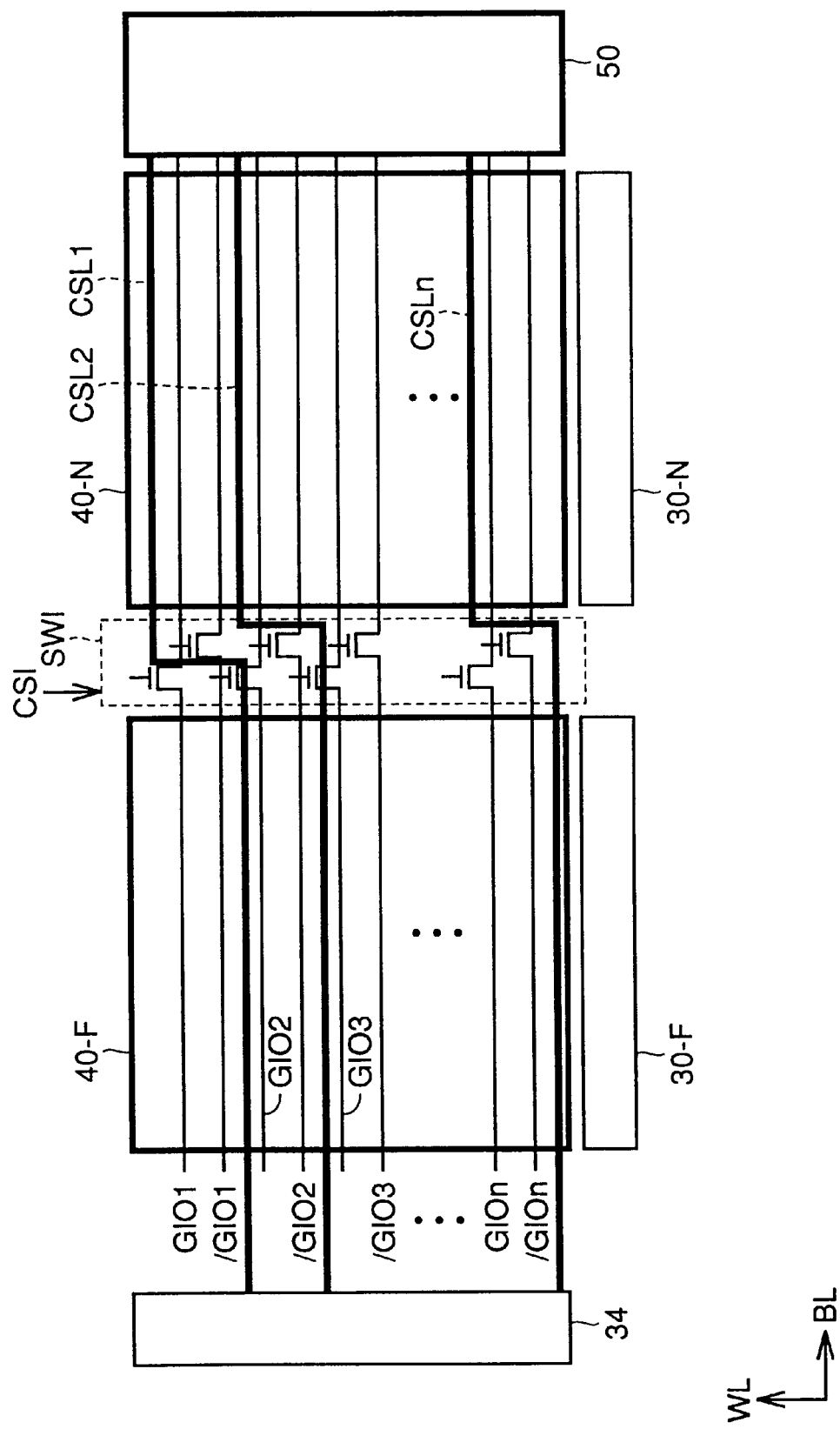
FIG. 20 is a diagram illustrating another exemplary arrangement of data lines and signal lines according to the modification of the fourth embodiment.

FIG. 20 shows another exemplary arrangement of data lines and signal lines according to the modification of the fourth embodiment.

Referring to FIG. 20, column selection lines CSL1 to CSLn transmit column selection signals corresponding to respective pairs of global data I/O lines.

Referring to FIG. 20, the column selection line CSL1 selects a column selection signal for a pair of global data I/O lines GIO1 and /GIO1, and the column selection line CSL2 transmits a column selection signal corresponding to a pair of global data I/O lines GIO2 and /GIO2. In an intermediate point provided with a switch group SWI, the data lines forming the pairs of global data I/O lines do not intersect with each other. The column selection lines CSL are bent stepwise at the intermediate point to be adjacent to the first ones of the data lines forming the pairs of global data I/O lines in a memory block 40-F and adjacent to second ones of the data lines in another memory block 40-N.

This structure is applied to each pair of global data I/O lines. Thus, influences of coupling noises from the pairs of global data I/O lines to the column selection lines CSL are out of phase with each other in the memory blocks 40-F and 40-N respectively. Consequently, noises can be reduced by canceling coupling noises from the pairs of global data I/O lines representing data lines to the column selection lines CSL, i.e., signal lines.

Fifth Embodiment

A fifth embodiment of the present invention is described with reference to a structure of reducing coupling noises between data lines forming pairs of global data I/O lines split into pairs of global read data buses and pairs of global write data buses as described with reference to the third embodiment.

Figure 21:
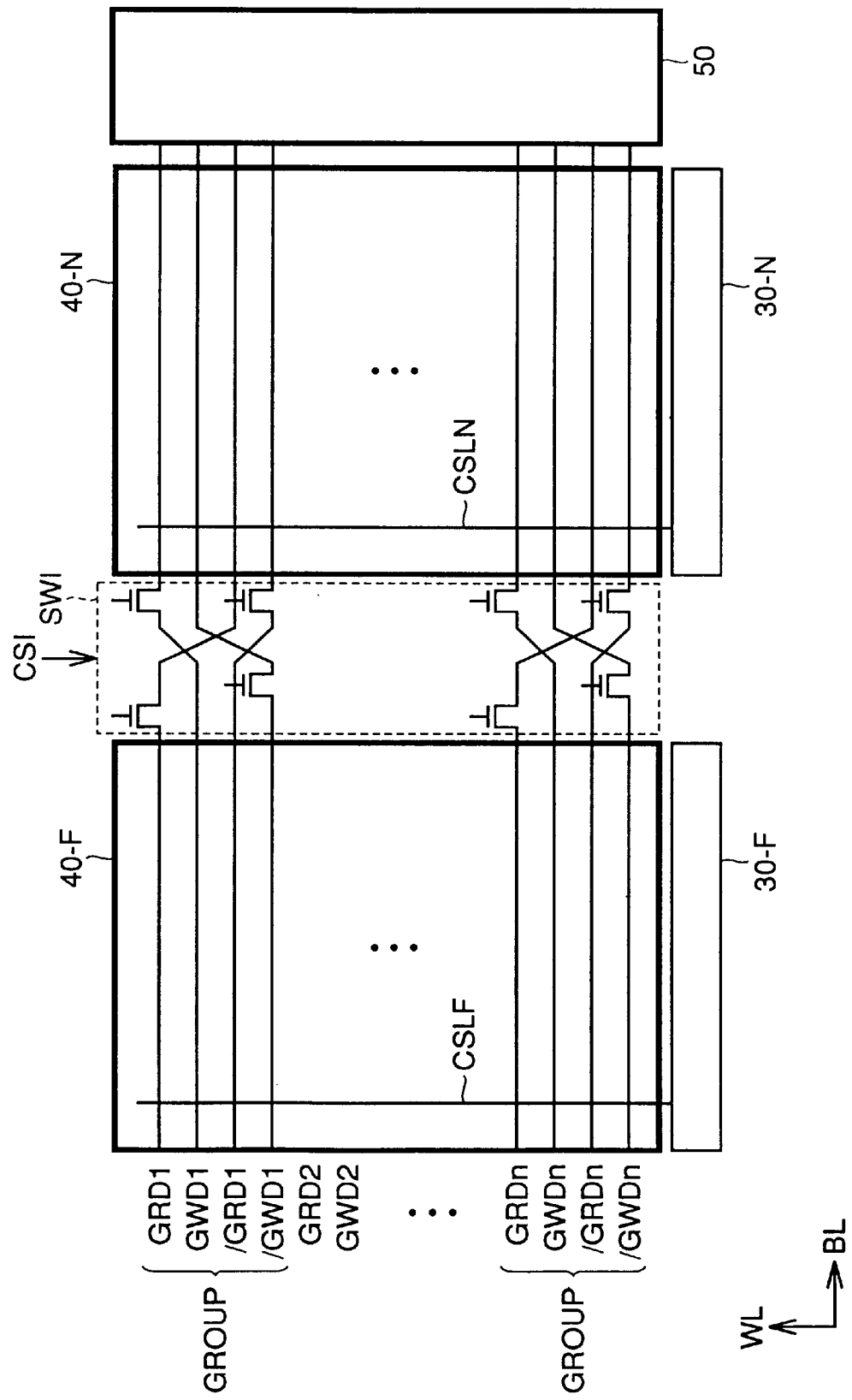
FIG. 21 is a diagram illustrating intersectional arrangement of data lines according to a fifth embodiment of the present invention.

FIG. 21 shows intersectional arrangement of data lines according to the fifth embodiment.

Referring to FIG. 21, pairs of global read data buses and pairs of global write data buses are split into groups of data buses provided in correspondence to the same memory cell columns so that the data lines forming the groups intersect with each other in the respective groups.

Referring to FIG. 21, a pair of global read data buses and a pair of global write data buses arranged in correspondence to the same memory cell column form each group. For example, a pair of global read data buses GRD1 and /GRD1 and a pair of global write data buses GWD1 and /GWD1 form a group.

In each group, single data lines forming the pair of global read data buses and the pair of global write data buses are arranged to intersect with each other similarly to the case of FIG. 18.

More specifically, the data lines are intersectionally arranged so that the pairs of global data I/O lines GIO1 and /GIO1 and GIO2 and /GIO2 shown in FIG. 18 correspond to the pair of global read data buses GRD1 and /GRD1 and the pair of global write data buses GWD1 and /GWD1 shown in FIG. 21 respectively.

Data of inverted signal levels are transmitted to the complementary lines forming the pairs of data buses respectively, and hence coupling noises on the individual data lines can be reduced similarly to the case shown in FIG. 18.

Modification of Fifth Embodiment

Figure 22:
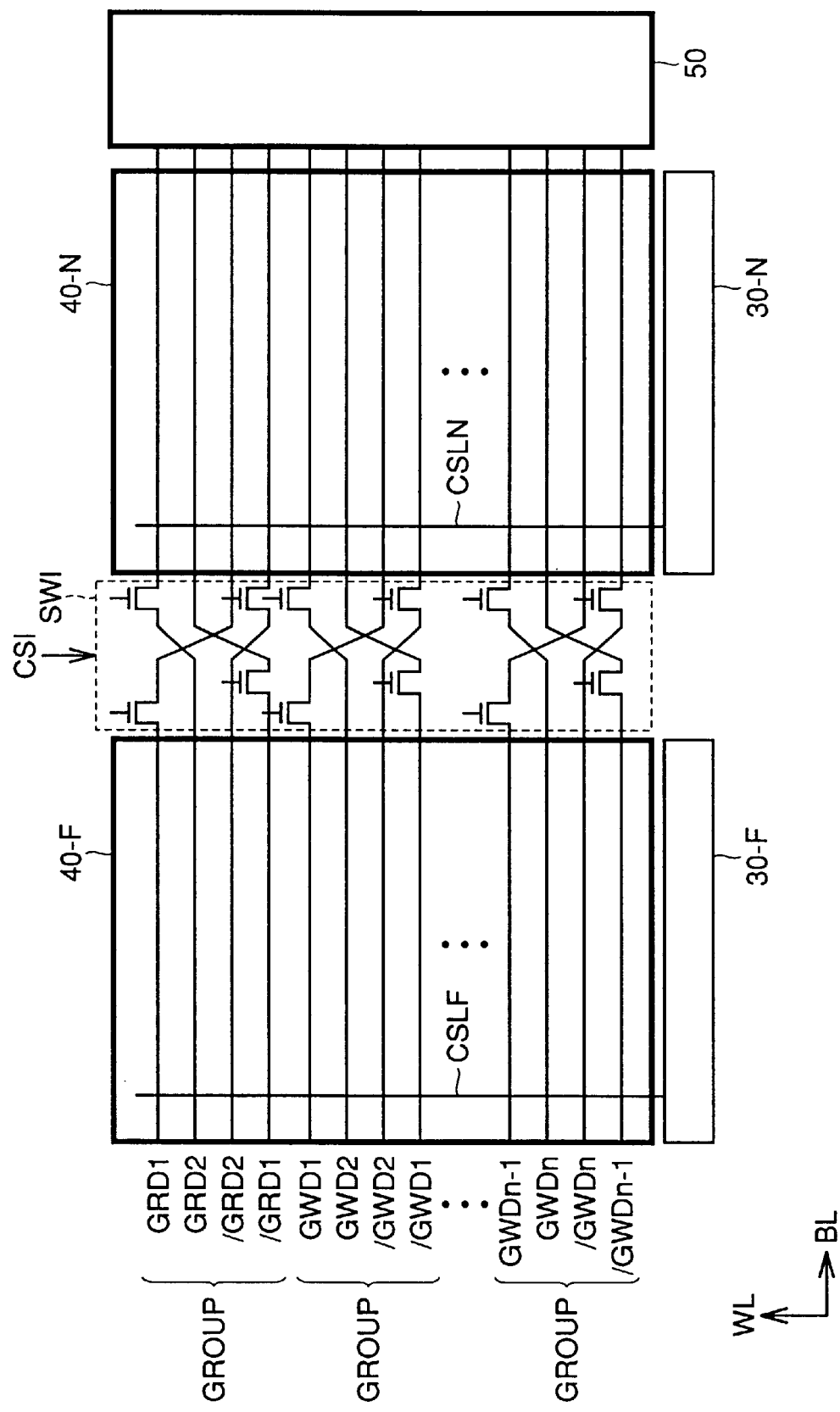
FIG. 22 is a diagram illustrating intersectional arrangement of data lines according to a modification of the fifth embodiment.

FIG. 22 shows intersectional arrangement of data lines according to a modification of the fifth embodiment.

Referring to FIG. 22, adjacent pairs of global read data buses or global read data buses form each group so that individual data lines intersect with each other in each group by a method similar to those described with reference to FIGS. 18 and 21.

For example, pairs of global read data buses GRD1 and /GRD1 and GRD2 and /GRD2 provided in correspondence to adjacent memory cell columns form a group. In this group, the data lines intersect with each other similarly to the case described with reference to FIG. 18. Coupling noises between the pairs of global read data buses GRD1 and /GRD1 and GRD2 and /GRD2 can be reduced due to this structure.

Similarly, pairs of global write data buses GWD1 and /GWD1 and GWD2 and /GWD2 provided in correspondence to adjacent memory cell columns also form a group so that similar data line intersection is executed in this group. Thus, coupling noises can be reduced between the pairs of global write data buses GWD1 and /GWD1 and GWD2 and /GWD2.

Referring to FIG. 22, coupling noises are reduced in both of pairs of global read data buses and pairs of global write data buses. In general, however, data reading is executed by amplifying small voltage signals read on data lines while data writing is performed by propagating signals driven to large amplitudes to data lines, and hence it can be said that data reading is more readily influenced by coupling noises.

In the structure shown in FIG. 22, therefore, only the pairs of global read data buses may be intersectionally arranged while not particularly intersectionally arranging the pairs of write data buses.

Sixth Embodiment

A sixth embodiment of the present invention is described with reference to a structure of executing n:1 (n is an integer at least 2) selection on simultaneously driven pairs of global data I/O lines for performing data input/output on part thereof in each bank.

Figure 23:
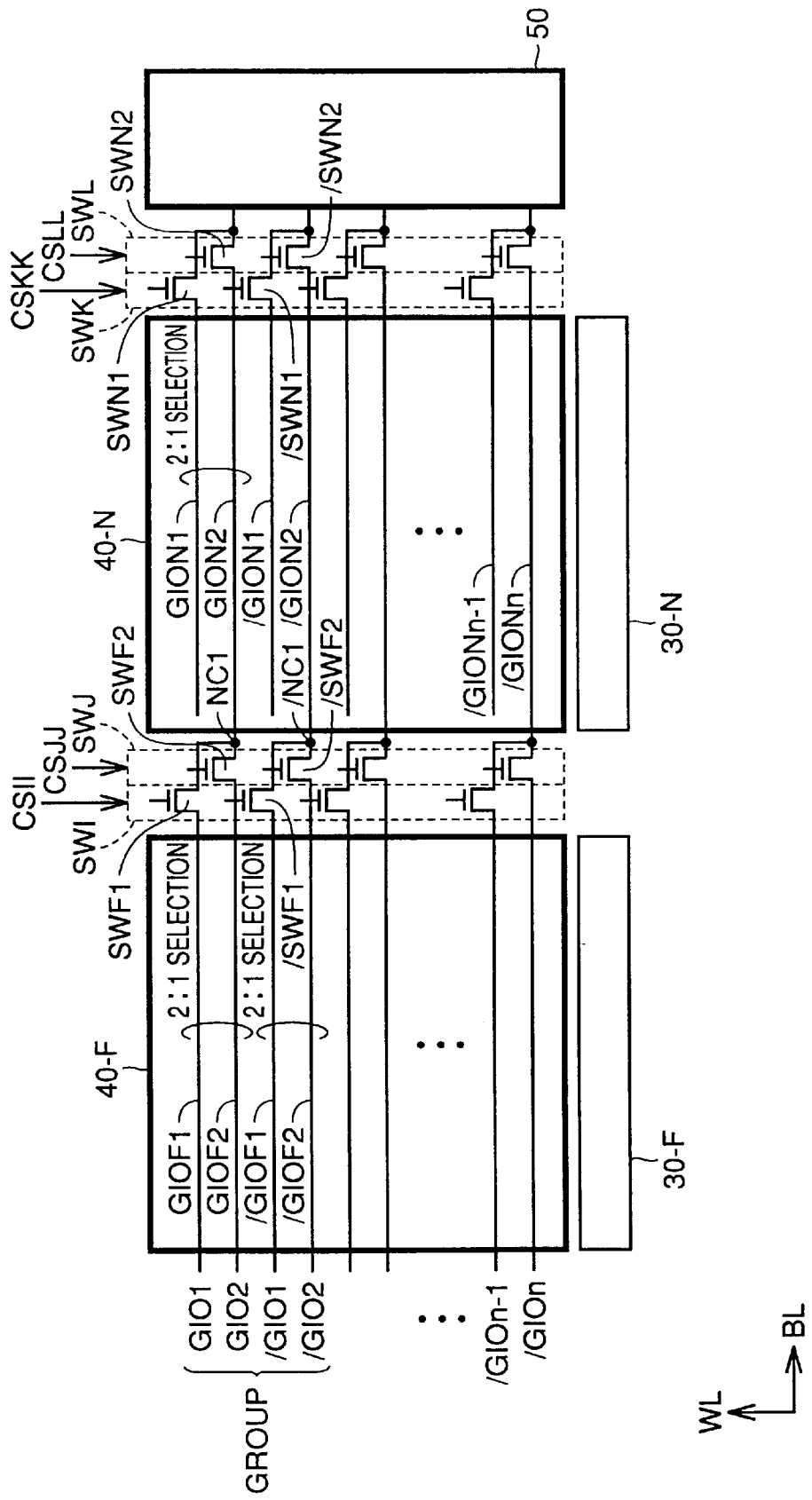
FIG. 23 is a diagram showing the structure of a memory cell array and the arrangement of pairs of global data I/O lines according to a sixth embodiment of the present invention.

FIG. 23 shows the structure of a memory cell array according to the sixth embodiment.

In the structure shown in FIG. 23, n=2, i.e., a 2:1 selector executes selection of data input/output in each bank, for example.

Referring to FIG. 23, switch groups split the memory cell array 40 according to the sixth embodiment into two memory blocks 40-F and 40-N similarly to the aforementioned embodiments. It is assumed that the memory blocks 40-F and 40-N form independent banks B1 and B2 respectively in FIG. 23. In the banks B1 and B2, 2:1 selection for pairs of global data I/O lines is executed in data input/output so that a pair of global data I/O lines are selected for each group formed by adjacent two pairs of global data I/O lines, i.e., eight memory cell columns, for executing data input/output.

Representatively describing the structure in a group formed by pairs of global data I/O lines GIOF1 and /GIOF1 and GIOF2 and /GIOF2 in the bank B1, for example, switches SWF1 and SWF2 are provided between the global data I/O lines GIOF1 and GIOF2 and an intermediate node NC1 respectively. Further, switches /SWF1 and /SWF2 are provided between the global data I/O lines /GIOF1 and /GIOF2 and an intermediate node /NC1 respectively. The switches SWF1 and /SWF1 are on-off controlled by a common control signal CSII, while the switches SWF2 and /SWF2 are turned on/off in common in response to another control signal CSJJ.

The switches SWF1 and SWF2 selectively connect the global data I/O lines GIOF1 and GIOF2 with the intermediate node NC1, while the switches /SWF1 and /SWF2 selectively connect the global data I/O lines /GIOF1 and /GIOF2 with the intermediate node /NC1. Thus, the switches SWF1, SWF2, /SWF1 and /SWF2 form a basic unit for a 2:1 selector, and a similar structure is applied to each group formed by the remaining two pairs of global data I/O lines.

Also in the memory block 40-N (bank B2), a basic unit for a 2:1 selector is arranged for each group formed by two pairs of global data I/O lines so that the pairs of global data I/O lines selected for each group are connected with a data input/output circuit 50.

Representatively describing the structure in a group formed by pairs of global data I/O lines GION1 and /GION1 and GION2 and /GION2 in the bank B2, for example, switches SWN1 and SWN2 are provided between the global data I/O lines GION1 and GION2 and the data input/output circuit 50 respectively. Further, switches /SWN1 and /SWN2 are provided between the global data I/O lines /GION1 and /GION2 and the data input/output circuit 50 respectively. The switches SWN1 and /SWN1 are on-off controlled by a common control signal CSKK, while the switches SWN2 and /SWN2L are turned on/off in common in response to another control signal CSLL.

In the memory block 40-N, a pair of global data I/O lines GION1 and /GION1 or GION2 and /GION2 are connected with corresponding intermediate nodes. For example, the global data I/O lines GION2 and /GION2 are connected with the intermediate nodes NC1 and /NC1 respectively. Thus, data can be transmitted between the memory block 40-F (bank B1) and the data input/output circuit 50 through the intermediate nodes NC1 and /NC1 by turning on the switches SWN2 and /SWN2.

Among switches SWF1 and /SWF1 to SWFn and /SWFn provided for the bank B1, those provided in correspondence to data lines forming odd pairs of global data I/O lines and controlled in common in response to the control signal CSII are generically referred to as a switch group SWI while those provided in correspondence to data lines forming even pairs of global data I/O lines and controlled in common in response to the control signal CSJJ are generically referred to as a switch group SWJ in the following description.

Similarly, among switches SWN1 and /SWN1 to SWNn and /SWNn provided for the bank B2, those provided in correspondence to data lines forming odd pairs of global data I/O lines and controlled in common in response to the control signal CSKK are generically referred to as a switch group SWK while those provided in correspondence to data lines forming even pairs of global data I/O lines and controlled in common in response to the control signal CSLL are generically referred to as a switch group SWL.

The switch groups SWI and SWJ execute 2:1 selection of pairs of global data I/O lines in the bank B1 while the switch groups SWK and SWL execute 2:1 selection of pairs of global data I/O lines in the bank B2 due to the aforementioned structure.

Decoding circuits 30-F and 30-N are also provided in a split manner for the banks B1 and B2 respectively.

As a result of 2:1 selection, m data (m is an integer represented by m=n/2) are transmitted between the memory cell array 40 and the data input/output circuit 50.

Timings for column selection and switch group control are now described. Also in the structure shown in FIG. 23, it is assumed that a column address is input precedently to input of a bank address signal in data reading, as described with reference to the first embodiment. Respective control timings in this case are described in comparison with the timing chart shown in FIG. 7.

Referring again to FIG. 7, a column address C1 is input before a time T3 for inputting a bank address signal for a read command R also in the sixth embodiment. Therefore, column selection in the bank B1 (memory block 40-F) is executed, before bank selection is defined, in response to the input column address C1. In other words, the decoding circuit 30-F executes column selection. This timing is identical to the timing for activating the column selection line CSLN in FIG. 7.

In the bank B1 (memory block 40-F), selection for pairs of global data I/O lines can be executed due to the definition of the column address C1. In other words, on/off selection of the switch groups SWI and SWJ is executed at the same timing as that for activating the column selection line CSLF in FIG. 7.

While no column selection is executed in the bank B2 (memory block 40-N) at this timing, operations after definition of bank selection can be quickly performed by precedently decoding an address signal.

When the bank address signal is input at a time T3 for defining the selected bank, the switch groups SWK and SWL are controlled.

When the bank B1 is selected through the bank address signal, the switch group SWL is turned on while the switch group SWK is kept off. No column selection is executed in the bank B2 (memory block 40-N). Thus, the bank B1 transmits data input/output in response to the column address to the data input/output circuit 50.

When the bank B2 is selected, both of the switch groups SWI and SWJ are turned off so that the decoding circuit 30-N executes column selection in response to a result of previously executed decoding of the column address while either one of the switch groups SWK and SWL is turned on. Thus, the bank B2 transmits data input/output in response to the column address to the data input/output circuit 50. The switch groups SWK and SWL are on-off controlled and column selection is executed in the bank B2 (memory block 40-N) at the same timing as that for activating the column selection line CSLN in FIG. 7.

Thus, the switch groups executing selection can be driven following preceding column selection in the bank far from the data input/output circuit 50 in the memory cell array structure essentially requiring n:1 selection due to the aforementioned structure, whereby data access can be speeded up.

Modification of Sixth Embodiment

A modification of the sixth embodiment is described with reference to a method of executing efficient data line connection between banks having different numbers of ways of data I/O lines.

Figure 24:
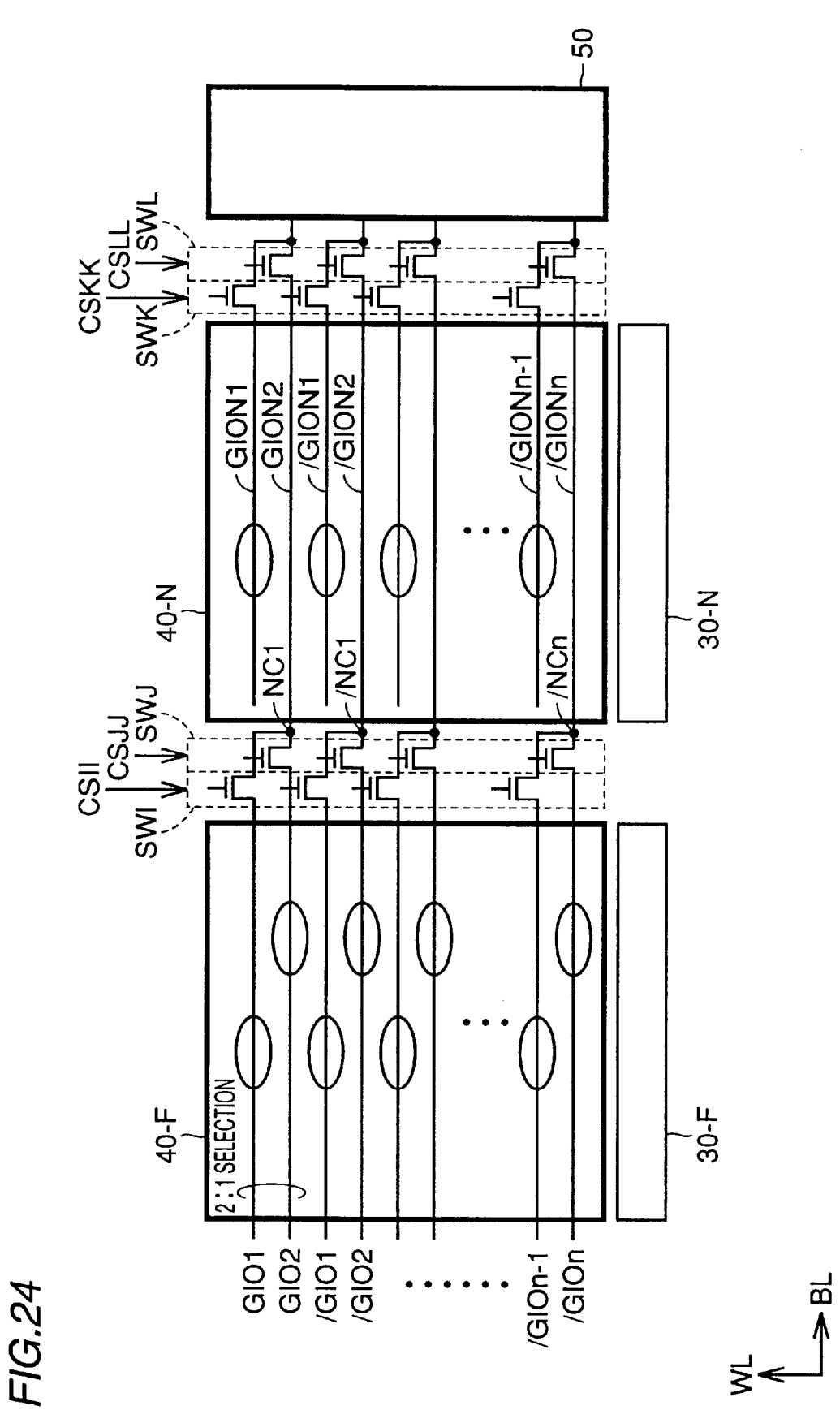
FIG. 24 is a diagram illustrating the structure of a memory cell array and the arrangement of pairs of global data I/O lines according to a modification of the sixth embodiment.

FIG. 24 shows an exemplary structure of a memory cell array according to the modification of the sixth embodiment of the present invention.

Referring to FIG. 24, the memory cell array is split into a memory block 40-F forming a bank B1 and a memory block 40-N forming a bank B2 similarly to the case shown in FIG. 23, and switch groups SWI and SWJ and switch groups SWK and SWL are arranged between the memory blocks 40-N and 40-F and between the memory block 40-N and a data input/output circuit 50 respectively.

In the modification of the sixth embodiment, the banks B1 and B2 provided in association with the same data input/output circuit 50 have different numbers of data ways. In the example shown in FIG. 24, it is assumed that the bank B1 has a four-way structure having a pair of global data I/O lines for four pairs of bit lines while the bank B2 has an eight-way structure having a pair of global data I/O lines for eight pairs of bit lines.

The pairs of global data I/O lines are connected with the pairs of bit lines in the banks 40-F and 40-N in the regions enclosed with ovals in FIG. 24. In the bank B2, even pairs of global data I/O lines, which are connected with no pairs of bit lines, only transmit data transferred between the bank B1 and the data input/output circuit 50.

The arrangement of the switch groups SWI, SWJ, SWK and SWL is similar to that shown in FIG. 23, and hence redundant description is not repeated.

The switch groups SWI and SWJ define a 2:1 selector for the bank B1, while the switch groups SWK and SWL correspond to selectors for the banks B1 and B2 due to the aforementioned structure.

Thus, the pairs of global data I/O lines in the bank B1 can be completely separated from those in the bank B2, and column selection can be simultaneously performed in the banks B1 and B2.

In comparison with the timing chart shown in FIG. 7 again, column selection can be simultaneously performed in the banks B1 and B2 at the timing for selecting the column selection line CSLF in correspondence to definition of the column address before input of the bank address signal (the input timing for the column address C1 before the time T3, for example) while turning off all switch groups SWI to SWL as an initial state. When keeping the switch groups SWK and SWL off at this timing, data do not compete on the pairs of global data I/O lines in the banks B1 and B2 also when either one of the switch groups SWI and SWJ is turned on in response to a result of decoding the column address.

Thereafter either one of the switch groups SWK and SWL is turned on at the timing for controlling the switch group SWI in the timing chart shown in FIG. 7 in response to definition of the bank address signal (the input timing for the bank address at the time T3, for example).

More specifically, the switch group SWL may be turned on when reading data from the bank B1, and the switch group SWK may be turned on when selecting the bank B2.

Thus, column selection in each bank and selection in the bank far from the data input/output circuit 50 can be executed before definition of bank selection in the structure coupling the banks having different numbers of data ways by a selector circuit, whereby data access can be speeded up.

Particularly when the bank B2 is selected in the aforementioned structure, the length of the pairs of global data I/O lines to be driven is half that of unsplit global data I/O lines, whereby power consumption can be reduced.

Seventh Embodiment

A seventh embodiment of the present invention is described with reference to a structure supplying a connection switch group provided on an intermediate point between data lines with a signal repeating function.

Figure 25:
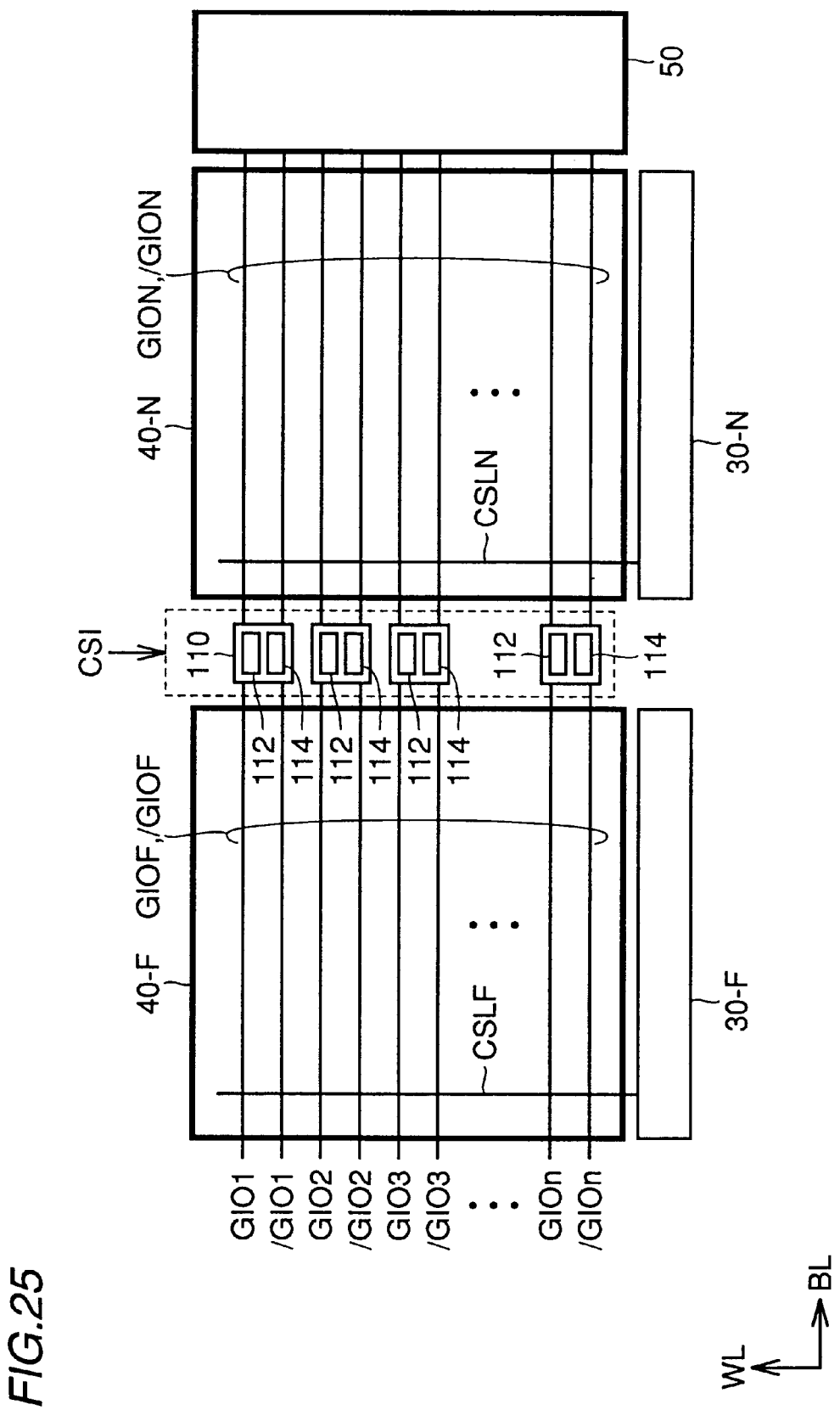
FIG. 25 is a diagram showing the structure of a memory cell array and the arrangement of pairs of global data I/O lines according to a seventh embodiment of the present invention.

FIG. 25 shows the structure of a memory cell array 40 according to the seventh embodiment. The structure shown in FIG. 25 corresponds to the structure of the memory cell array 40 shown in FIG. 5, and the former is different from the latter in a point that the same has a repeater circuit 110 for each pair of global data I/O lines in place of the switch group SWI described with reference to FIG. 5. The remaining structure and operations are identical to those described with reference to FIG. 5, and hence redundant description is not repeated.

A control signal CSI for controlling the switch group SWI described with reference to FIG. 5 in common controls each repeater circuit 110.

The repeater circuit 110 has a read data repeat circuit 112 having a function of repeating read data in the corresponding pair of global data I/O lines and a write data repeat circuit 114 having a function of repeating write data.

Figure 26:
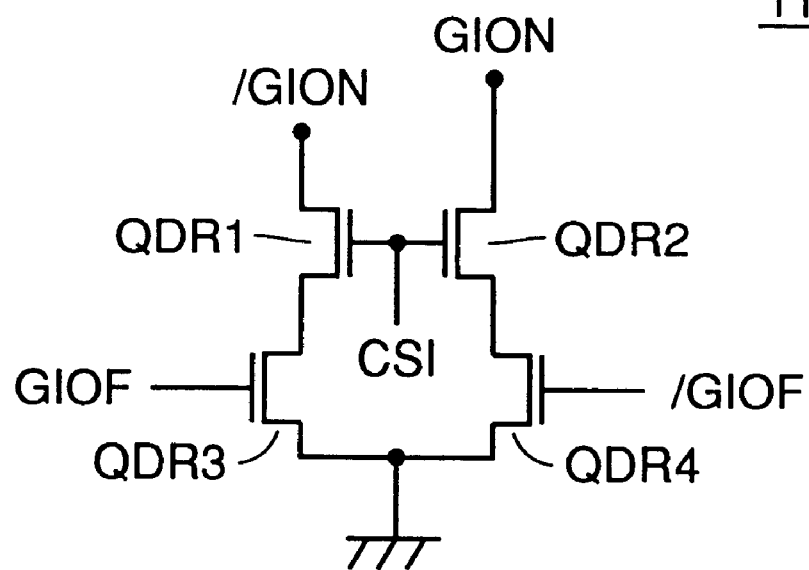
FIG. 26 is a circuit diagram showing the structure of a read data repeat circuit 112.

FIG. 26 is a circuit diagram showing the structure of the read data repeat circuit 112. Referring to FIG. 26, symbols GIOF and /GIOF denote a pair of global data I/O lines, split by the repeater circuit 110, corresponding to a memory block 40-F and symbols GION and /GION denote a pair of global data I/O lines corresponding to a memory block 40-N.

The read data repeat circuit 112 includes transistors QDR2 and QDR4 serially connected between the global data I/O line GIOF and a ground node and transistors QDR1 and QDR3 serially connected between the global data I/O line /GION and the ground node.

The control signal CSI is supplied to the gates of the transistors QDR1 and QDR2. The complementary global data I/O lines GIOF and /GIOF are coupled to the gates of the transistors QDR3 and QDR4 respectively.

When the control signal CSI is activated for transmitting data read from the memory block 40-F to the pair of global data I/O lines GION and /GION of the memory block 40-N, either one of the global data I/O lines GION and /GION is connected to the ground node to develop a voltage drop in response to the signal levels of the data transmitted by the pair of global data I/O lines GIOF and /GIOF due to the aforementioned structure. The data read from the memory block 40-F can be transmitted to the data input/output circuit 50 by amplifying voltage difference caused by the voltage drop by the data input/output circuit 50.

Figure 27:
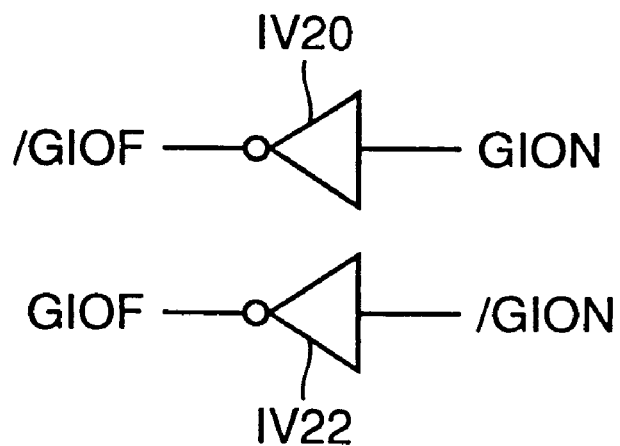
FIG. 27 is a circuit diagram showing the structure of a write data repeat circuit 114.

FIG. 27 is a circuit diagram showing the structure of the write data repeat circuit 114. The write data repeat circuit 114 includes inverters IV20 and IV22 for transmitting write data from the memory block 40-N to the memory block 40-F. The inverter IV20 inverts data of the global data I/O line GION and outputs the inverted data to the global data I/O line /GIOF. Similarly, the inverter IV22 inverts data transmitted to the global data I/O line /GION and outputs the inverted data to the global data I/O line GIOF.

The write data output from the data input/output circuit 50 can be transmitted to the memory block 40-F after being amplified by the inverters IV20 and IV22 due to the aforementioned structure. Thus, influence exerted by a signal propagation delay caused in data lines increased in length can be reduced by providing the repeater circuit 110 at the intermediate point. The data input/output can be further speeded up while suppressing increase of the circuit area by arranging such a repeater circuit 110 in place of the switch group SWI provided for splitting the pairs of global data I/O lines or the pairs of global read/write data buses described with each of the first to sixth embodiments.

Eighth Embodiment

An eighth embodiment of the present invention is described with reference to a structure applying splitting of the pairs of global data I/O lines or the pairs of global data buses described above also to bit lines in each sense amplifier block.

Figure 28:
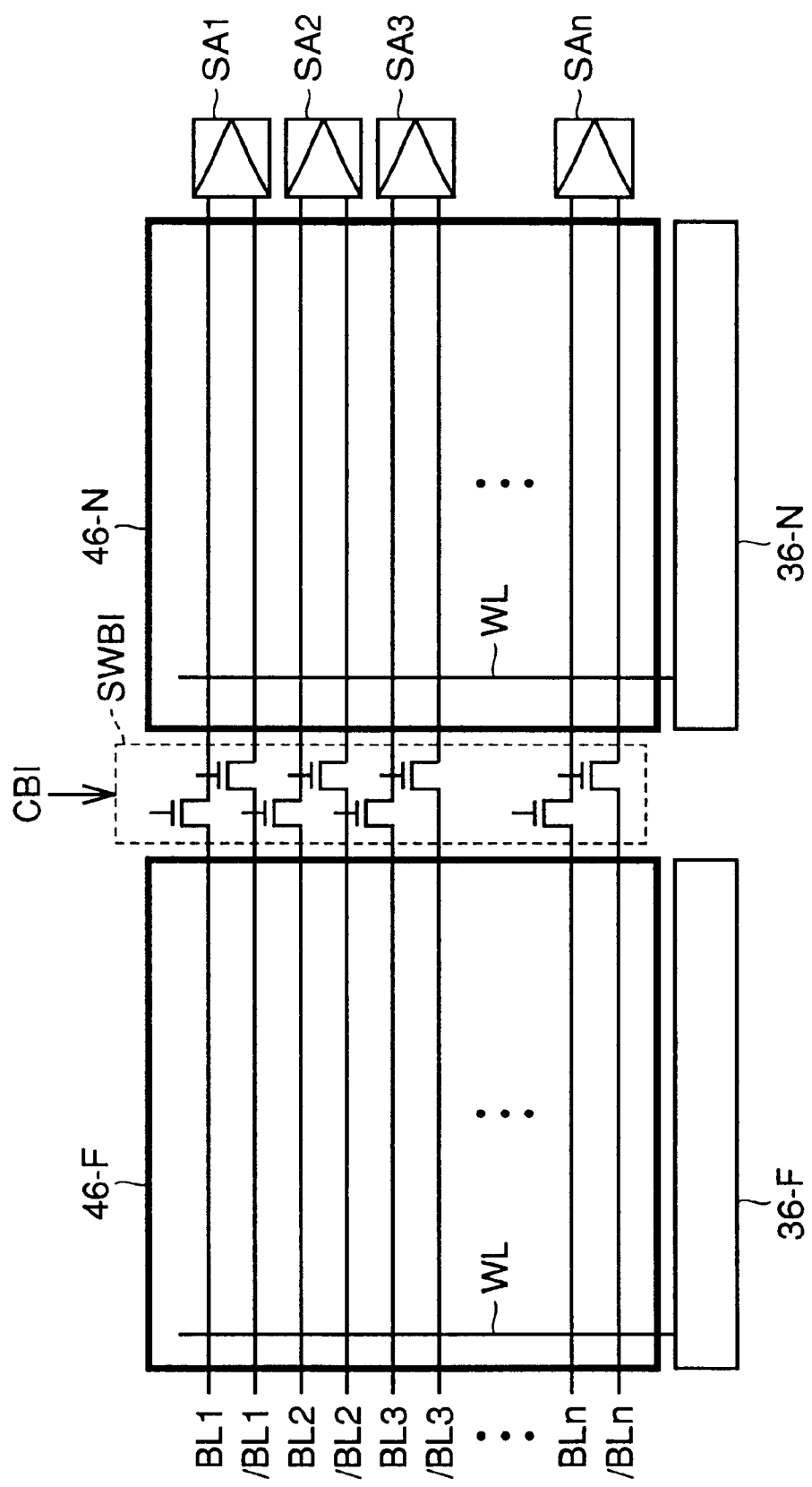
FIG. 28 is a conceptual diagram illustrating the structure of a sense amplifier block 44 according to an eighth embodiment of the present invention.

FIG. 28 shows the structure of a sense amplifier block 44 according to the eighth embodiment.

Referring to FIG. 28, pairs of bit lines BL1 and /BL1 to BLn and /BLn provided for respective memory cell columns are connected with sense amplifiers SA1 to SAn in the sense amplifier block 44. Data input/output for the pairs of bit lines BL1 and /BL1 to BLn to /BLn is executed through a column selection gate (not shown) described with reference to FIG. 3 or 4.

A switch group SWBI splits the sense amplifier block 44 into blocks 46-F and 46-N. Subdivided subdecoder circuits 36-F and 36-N are provided in correspondence to the blocks 46-F and 46-N respectively.

In the structure shown in FIG. 28 corresponding to that shown in FIG. 5, the blocks 46-F and 46-N, the subdecoder circuits 36-F and 36-N, the switch group SWBI and the sense amplifiers SA1 to SAn are associated with the memory blocks 40-F and 40-N, the decoding circuits 30-F and 30-N, the switch group SWI and the data input/output circuit 50 respectively.

An effect of reducing power consumption similar to that of the third embodiment can be attained when activating the bit lines BL1 and /BL1 to BLn to /BLn in the sense amplifier block 44 having the aforementioned structure by executing column selection by the subdecoder circuits 36-F and 36-N and control of the switch group SWBI at the timing described with reference to FIG. 10.

Ninth Embodiment

A ninth embodiment of the present invention is described with reference to a structure reducing coupling noises between pairs of bit lines through intersectional arrangement of data lines described with reference to the fourth and fifth embodiments when each memory cell has a plurality of ports.

Figure 29:
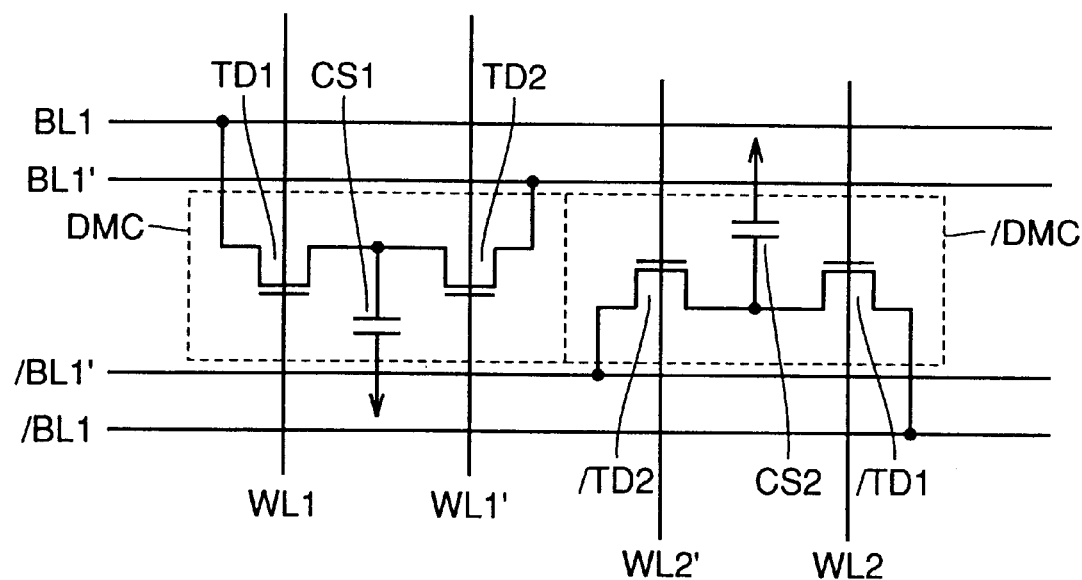
FIG. 29 is a circuit diagram showing the structures of dual port memory cells.

FIG. 29 shows dual port memory cells DMC and /DMC as representative examples of memory cells each having a plurality of ports.

Referring to FIG. 29, the dual port memory cell DMC has two access transistors TD1 and TD2 for a data storage capacitor CS1. The dual port memory cell /DMC, holding data complementary to that in the dual port memory cell DMC, has a data storage capacitor CS2 and two access transistors /TD1 and /TD2.

Two pairs of bit lines BL1 and /BLI and BL1' and /BL1' are provided in correspondence to memory cell columns to which the dual port memory cells DMC and /DMC belong. Further, different word lines WL1 and WL1' are provided in correspondence to the two access transistors TD1 and TD2 forming the dual port memory cell DMC.

Data stored in the capacitor CS1 is read on the bit line BL1 or BL1' in response to selection of the word line WL1 or WL1'.

Similarly, different word lines WL2 and WL2' are provided in correspondence to the two access transistors /TD1 and /TD2 forming the dual port memory cell /DMC respectively.

Data stored in the capacitor CS2 is read on the bit line /BL1 for transmitting data complementary to that on the bit line BL1 in response to selection of the word line WL2. In response to selection of the word line WL2', the data stored in the capacitor CS2 is read on the bit line /BL1' for transmitting data complementary to that on the bit line BL1'.

Figure 30:
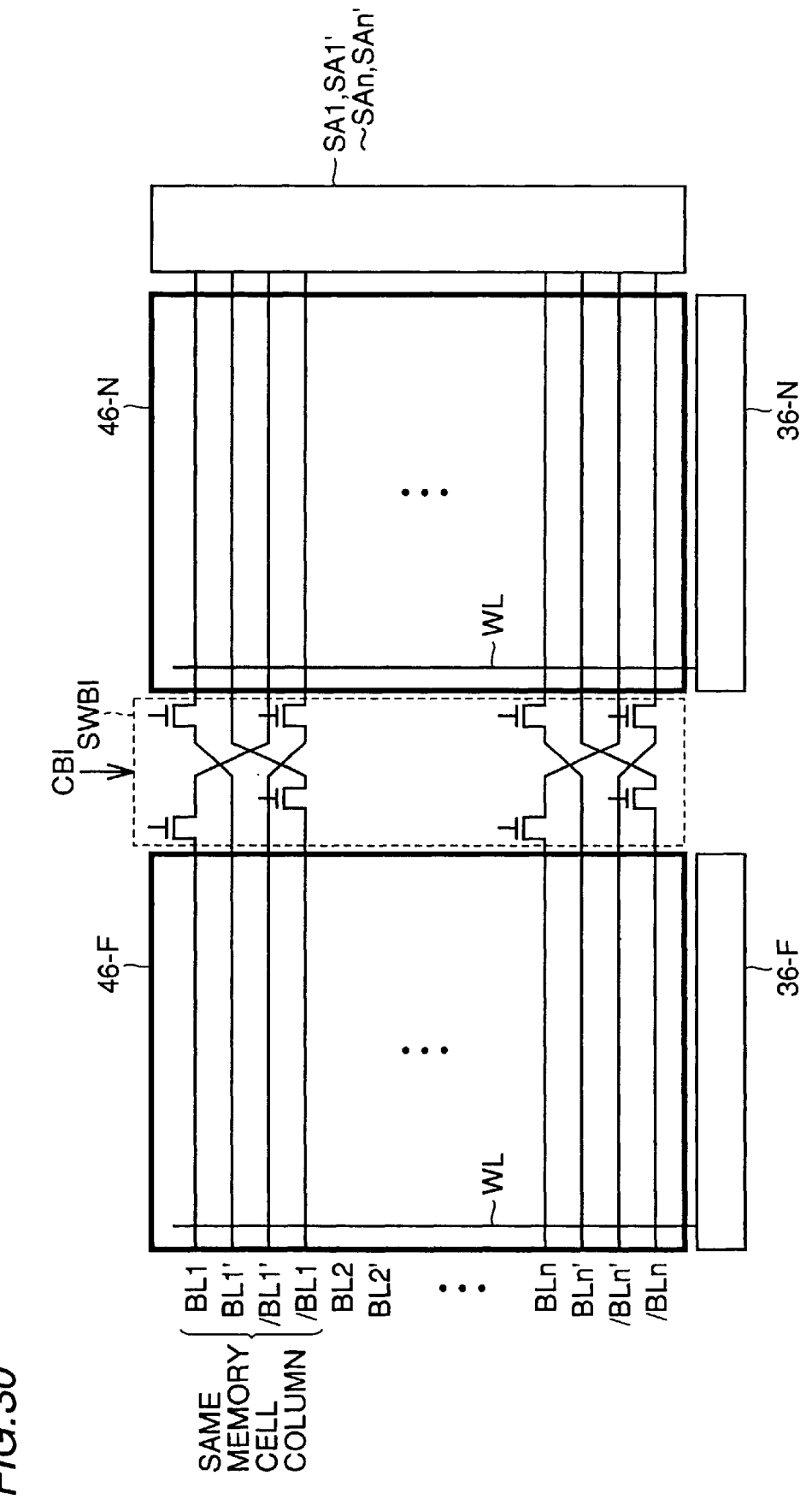
FIG. 30 is a diagram illustrating intersectional arrangement of pairs of bit lines according to a ninth embodiment of the present invention.

FIG. 30 shows intersectional arrangement of the pairs of bit lines according to the ninth embodiment.

Referring to FIG. 30, two pairs of bit lines provided in correspondence to the same memory cell column of dual port memory cell form a group to intersect with each other in this group. The intersectional arrangement of the pairs of bit lines in each group is similar to that described with reference to FIG. 18, and hence redundant description is not repeated.

Coupling noises between simultaneously activated two pairs of bit lines provided in correspondence to the same memory cell column can be reduced due to the aforementioned structure, for reducing noises in data reading and data writing for a dual port memory cell array.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor memory device performing data input/output in response to an address signal, comprising:

a memory cell array, having a plurality of memory cells arranged in rows and columns along first and second directions, split into a plurality of memory blocks along said first direction so that any one of said plurality of memory blocks is selected in response to said address signal to be subjected to said data input/output;

a data input/output circuit arranged to be adjacent to one of said plurality of memory blocks along said second direction for executing reading and writing of the data on said memory cell array;

a plurality of data lines provided in common to said plurality of memory blocks along said second direction for transmitting said data between said memory cell array and said data input/output circuit;

a plurality of data line connection switching circuits each arranged between adjacent said memory blocks for splitting said plurality of data lines into regions corresponding to respective said memory blocks;

a plurality of decoding circuits provided in correspondence to said plurality of memory blocks respectively for executing row selection and column selection responsive to said address signal; and a control circuit instructing execution of said row selection and said column selection to each said decoding circuit and on-off controlling each said data line connection switching circuit in response to said address signal.

2. The semiconductor memory device according to claim 1, wherein said control circuit instructs execution of said column selection in at least one of said plurality of memory blocks decided in accordance with the distance from said data input/output circuit on said data line while each said data line connection switching circuit being turned off before selection of said plurality of memory blocks is defined, and said control circuit instructs execution of said column selection when said column selection in selected said memory block is unexecuted after selection of said plurality of memory blocks is defined while turning on at least one of said plurality of data line connection switching circuit so that said data can be transmitted between the selected memory block and said data input/output circuit.

3. The semiconductor memory device according to claim 2, wherein said semiconductor memory device synchronously operates in response to a clock signal repeating transition between a first state and a second state in a constant cycle, said address signal includes:

a first address signal for selecting said plurality of memory blocks, a second address signal for executing said row selection, and a third address signal for executing said column selection, said second address signal is input at a first transition timing of said clock signal, said first address signal is input at a second transition timing later than said first transition timing, and said third address signal is input between said first and second transition timings.

4. The semiconductor memory device according to claim 1, wherein said control circuit instructs execution of said column selection in selected said memory block and turns on each said data line connection switching circuit arranged between the selected memory block and said data input/output circuit.

5. The semiconductor memory device according to claim 4, wherein said memory cell array is formed by a plurality of banks, each said bank has the same number of said memory blocks, each of said plurality of data line connection switching circuits splits each of said plurality of data lines into a plurality of subdata lines corresponding to said plurality of memory blocks respectively, and each said bank and each said memory block are so associated with each other that the number of said subdata lines driven for data transmission is equal among said plurality of subdata lines whichever said bank is selected.

6. The semiconductor memory device according to claim 5, wherein said memory blocks are formed by further splitting said memory cell array along said second direction in addition to said first direction.

7. The semiconductor memory device according to claim 4, wherein said plurality of data lines are arranged for each said bank, and said plurality of data lines corresponding to one of said plurality of banks are connected with only said memory blocks corresponding to said one of the plurality of banks for performing data transfer.

8. The semiconductor memory device according to claim 1, wherein
said plurality of data lines are split into a plurality of groups each having a plurality of said data lines,
each of said plurality of data lines includes first and second data single lines transmitting complementary data,
each of said first and second data single lines forming one of said plurality of data lines in the same said group is arranged to intersect with at least one of said first and second data single lines forming another one of said plurality of data lines in at least one of regions where said data line connection switching circuits are arranged, and
each of said first and second data single lines forming said one of the plurality of data lines is adjacent to said first and second data lines forming said another one of the plurality of data lines in regions corresponding to different said memory blocks.

9. The semiconductor memory device according to claim 1, wherein
said plurality of data lines are divided into a plurality of groups each having a plurality of said data lines,
each of said plurality of data lines includes first and second data single lines transmitting complementary data,
said semiconductor memory device further comprises a plurality of signal transmission lines arranged in a direction along said plurality of data lines in correspondence to said plurality of groups respectively, and
said first and second data single lines are arranged to intersect with each other in at least one of regions where said data line connection switching circuits are arranged.

10. The semiconductor memory device according to claim 1, wherein
each of said plurality of data lines includes first and second data single lines transmitting complementary data,
said semiconductor memory device further comprises a plurality of signal transmission lines arranged in a direction along said plurality of data lines corresponding to said plurality of data lines respectively, and
said plurality of signal transmission lines are arranged across a corresponding one of said plurality of data lines in at least one of regions where said data line connection switching circuits are arranged.

11. The semiconductor memory device according to claim 1, wherein
each of said plurality of data lines includes:
a write data line transmitting input data to said memory cell array, and
a read data line transmitting output data from said memory cell array.

12. The semiconductor memory device according to claim 11, wherein
each of said plurality of data line connection switching circuits is provided in correspondence to only either one of said write data line and said read data line.

13. The semiconductor memory device according to claim 11, wherein
said write data line includes first and second write data single lines transmitting complementary data,
said read data line includes first and second read data single lines transmitting complementary data,
each of said first and second write data single lines is arranged to intersect with at least one of said first and second read data single lines in at least one of regions where said data line connection switching circuits are arranged, and
each of said first and second read data single lines is adjacent to said first and second write data single lines respectively in regions corresponding to different said memory blocks.

14. The semiconductor memory device according to claim 11, wherein
said write data line includes first and second write data single lines transmitting complementary data,
said read data line includes first and second read data single lines transmitting complementary data,
each of said first and second write data single lines forming each said write data line is arranged to intersect with at least one of said first and second write data single lines forming adjacent said write data line in at least one of regions where said data line connection switching circuits are arranged, and
each of said first and second read data single lines forming each said read data line is arranged to intersect with at least one of said first and second read data single lines forming adjacent said read data line in at least one of said regions where said data line connection switching circuits are arranged.

15. The semiconductor memory device according to claim 11, wherein
each of said plurality of data line connection switching circuits includes:
a first repeater circuit amplifying and transmitting input data to selected said memory block in a direction away from said data input/output circuit, and
a second repeater circuit amplifying and transmitting output data from selected said memory block in a direction toward said data input/output circuit.

16. A semiconductor memory device performing data input/output in response to an address signal, comprising:
a memory cell array, having a plurality of memory cells arranged in rows and columns along first and second directions, split into a plurality of sense amplifier blocks along said first direction so that each of said plurality of sense amplifier blocks is split into a plurality of row blocks along said first direction, any one of said plurality of row blocks is selected in response to said address signal to be subjected to said data input/output and each said sense amplifier block includes:
a plurality of pairs of bit lines provided corresponding to memory cell columns along said second direction in common to said plurality of row blocks,
a sense amplifier circuit arranged adjacently to one of said row blocks along said second direction for amplifying data on said plurality of pairs of bit lines, and
a plurality of bit line connection switching circuits each arranged between adjacent said row-blocks for splitting said plurality of pairs of bit lines into regions corresponding to respective said row blocks;
a plurality of decoding circuits provided corresponding to said plurality of row blocks respectively for executing row selection and column selection responsive to said address signal; and
a control circuit instructing execution of said column selection in selected said row block and turning on each said bit line connection switching circuit arranged between the selected row block and said sense amplifier circuit.

17. The semiconductor memory device according to claim 16, wherein
- each said memory cell has K (K: natural number of at least 2) ports,
- K said pairs of bit lines are provided for each said memory cell column,
- each said pair of bit lines include first and second bit single lines transmitting complementary data, and
- each of said first and second bit single lines forming one of said pairs of bit lines corresponding to one of said memory cell columns is arranged to intersect with at least one of said first and second bit single lines forming another one of said pairs of bit lines corresponding to said one of said memory cell columns.

18. A semiconductor memory device performing data input/output in response to an address signal, comprising:
- a memory cell array, having a plurality of memory cells arranged in rows and columns along first and second directions, split along said first direction into a plurality of memory blocks including first and second memory blocks, either one of which is selected in response to said address signal to be subjected to said data input/output;
- a data input/output circuit executing reading and writing of the data on said memory cell array;
- a plurality of (M) first data lines provided (M: natural number) corresponding to said first memory block along said second direction and split into a plurality of groups each including N (N: natural number smaller than M) said first data lines;
- a plurality of intermediate nodes provided in correspondence to said plurality of groups respectively;
- a plurality of (M) second data lines provided corresponding to said second memory block along said second direction and split into a plurality of groups each including N said second data lines so that one said second data line of each said group of said plurality of second data lines is connected to a corresponding one of said plurality of intermediate nodes;
- M first data line connection switching circuits each provided between each of said M first data lines and corresponding each of said plurality of intermediate nodes;
- M second data line connection switching circuits each provided between each of said M second data lines and said data input/output circuit;
- a plurality of decoding circuits provided in correspondence to said plurality of memory blocks respectively for executing row selection and column selection in response to said address signal, said plurality of decoding circuits including:
  - a first sub decoding circuit provided corresponding to said first memory block, and
  - a second sub decoding circuit provided corresponding to said second memory block; and
- a control circuit instructing execution timings for said row selection and said column selection to said first and second sub decoding circuits in response to said address signal while on-off controlling M said first and second data line connection switching circuits.

19. The semiconductor memory device according to claim 18, wherein
- said control circuit executes said column selection in said first memory block and selectively turns on one of N said first data line connection switching circuits in each said group while each said second data line connection switching circuit being turning off before selection of said memory blocks responsive to said address signal is defined, and
- said control circuit, when selection of said first memory block is defined, turns on one of N said second data line connection switching circuits corresponding to one of said N second data lines connected with said intermediate node,
- when selection of said second memory block is defined, turns off each said first data line connection switching circuit, executes said column selection in said second memory block, and selectively turns on one of N said second data line connection switching circuits for each said group.

20. The semiconductor memory device according to claim 18, wherein
- one of N said second data lines connected with corresponding one of said plurality of intermediate nodes is disconnected with said second memory block in each said group, and
- said control circuit executes said column selection in both of said first and second memory blocks while selectively turning on one of N said first data line connection switching circuits in each said group before selection of said memory blocks is defined and selectively turns on one of N said second data line connection switching circuits in each said group after selection of said memory blocks is defined.

* * * * *